(12) United States Patent
Zhang et al.

(10) Patent No.: US 12,101,077 B2
(45) Date of Patent: Sep. 24, 2024

(54) BULK ACOUSTIC WAVE DEVICE WITH RAISED FRAME STRUCTURE

(71) Applicant: Skyworks Global Pte. Ltd., Singapore (SG)

(72) Inventors: Benfeng Zhang, Moriguchi (JP); Jiansong Liu, Irvine, CA (US); Benjamin Paul Abbott, Irvine, CA (US); Kwang Jae Shin, Yongin (KR); Alexandre Augusto Shirakawa, Cardiff by the Sea, CA (US)

(73) Assignee: Skyworks Global Pte. Ltd., Singapore (SG)

( * ) Notice: Subject to any disclaimer, the term of this patent is extended or adjusted under 35 U.S.C. 154(b) by 233 days.

(21) Appl. No.: 17/472,199

(22) Filed: Sep. 10, 2021

(65) Prior Publication Data

US 2022/0094335 A1  Mar. 24, 2022

Related U.S. Application Data

(60) Provisional application No. 63/080,530, filed on Sep. 18, 2020.

(51) Int. Cl.
*H03H 9/02* (2006.01)
*H03F 3/19* (2006.01)
(Continued)

(52) U.S. Cl.
CPC .......... *H03H 9/02118* (2013.01); *H03F 3/19* (2013.01); *H03H 9/0014* (2013.01);
(Continued)

(58) Field of Classification Search
CPC .......... H03H 9/02007–02157; H03H 9/02118; H03H 9/0014; H03H 9/02015;
(Continued)

(56) References Cited

U.S. PATENT DOCUMENTS 6,476,536 B1   11/2002   Pensala
6,548,943 B2   4/2003    Kaitila et al.
(Continued)

FOREIGN PATENT DOCUMENTS

CN   110635775   12/2019
GB   2418791     4/2006
(Continued)

OTHER PUBLICATIONS

U.S. Appl. No. 17/471,604 Published as 2022/0094323 A1, filed Sep. 19, 2021, Bulk Acoustic Wave Device With Multi-Grandient Raised Frame.
(Continued)

*Primary Examiner* — Raymond S Dean
(74) *Attorney, Agent, or Firm* — Knobbe, Martens, Olson & Bear, LLP

(57) ABSTRACT

Aspects of this disclosure relate to a bulk acoustic wave device with a multi-layer raised frame. The bulk acoustic wave device includes a first electrode, a second electrode, a piezoelectric layer positioned between the first electrode and the second electrode, and a multi-layer raised frame structure configured to cause lateral energy leakage from a main acoustically active region of the bulk acoustic wave device to be reduced. The multi-layer raised frame structure includes a first raised frame layer embedded in the piezoelectric layer and a second raised frame layer. The first raised frame layer has a lower acoustic impedance than the piezoelectric layer.

20 Claims, 29 Drawing Sheets

(51) Int. Cl.
  *H03H 9/00* (2006.01)
  *H03H 9/05* (2006.01)
  *H03H 9/13* (2006.01)
  *H03H 9/17* (2006.01)
  *H03H 9/54* (2006.01)
  *H03H 9/56* (2006.01)
  *H04B 1/40* (2015.01)

(52) U.S. Cl.
  CPC ...... *H03H 9/02015* (2013.01); *H03H 9/0504* (2013.01); *H03H 9/13* (2013.01); *H03H 9/132* (2013.01); *H03H 9/171* (2013.01); *H03H 9/173* (2013.01); *H03H 9/54* (2013.01); *H03H 9/568* (2013.01); *H04B 1/40* (2013.01); *H03F 2200/451* (2013.01)

(58) Field of Classification Search
  CPC ........ H03H 9/0504; H03H 9/13; H03H 9/132; H03H 9/171; H03H 9/173; H03H 9/54; H03H 9/568; H03F 3/19; H03F 2200/451; H04B 1/40
  See application file for complete search history.

(56) References Cited

U.S. PATENT DOCUMENTS

| | | |
|---|---|---|
| 6,812,619 B1 | 11/2004 | Kaitila et al. |
| 7,280,007 B2 | 10/2007 | Feng et al. |
| 7,369,013 B2 | 5/2008 | Fazzio et al. |
| 7,554,426 B2 | 6/2009 | Lee et al. |
| 7,602,102 B1 | 10/2009 | Barber et al. |
| 7,805,820 B2 | 10/2010 | Eggs et al. |
| 7,978,025 B2 | 7/2011 | Yokoyama et al. |
| 8,248,185 B2 | 8/2012 | Choy et al. |
| 8,441,328 B2 | 5/2013 | Shin |
| 8,476,995 B2 | 7/2013 | Shin |
| 8,483,104 B1 | 7/2013 | Saji et al. |
| 8,981,876 B2 | 3/2015 | Jamneala et al. |
| 9,148,117 B2 | 9/2015 | Burak et al. |
| 9,197,185 B2 | 11/2015 | Zou et al. |
| 10,284,168 B2 | 5/2019 | Ivira et al. |
| 11,082,023 B2 | 8/2021 | Shin et al. |
| 2009/0134957 A1 | 5/2009 | Shin |
| 2014/0191826 A1 | 7/2014 | Hashimoto et al. |
| 2014/0225683 A1 | 8/2014 | Burak et al. |
| 2014/0232486 A1 | 8/2014 | Burak |
| 2014/0273881 A1 | 9/2014 | Tajic |
| 2015/0280687 A1 | 10/2015 | Burak et al. |
| 2015/0326200 A1* | 11/2015 | Grannen ............ H03H 9/02102 |
| | | 310/346 |
| 2016/0126930 A1 | 5/2016 | Zou et al. |
| 2017/0033769 A1 | 2/2017 | Yokoyama |
| 2017/0111028 A1* | 4/2017 | McCarron ................ H03H 3/02 |
| 2017/0170809 A1 | 6/2017 | Yokoyama et al. |
| 2017/0207768 A1 | 7/2017 | Liu et al. |
| 2017/0230031 A1 | 8/2017 | Yokoyama et al. |
| 2017/0244021 A1 | 8/2017 | Han et al. |
| 2017/0366157 A1 | 12/2017 | Liu et al. |
| 2017/0373668 A1 | 12/2017 | Nishihara et al. |
| 2018/0006631 A1 | 1/2018 | Kida et al. |
| 2018/0013397 A1 | 1/2018 | Lim et al. |
| 2018/0175275 A1 | 6/2018 | Nishihara et al. |
| 2018/0219528 A1 | 8/2018 | Liu et al. |
| 2018/0277735 A1 | 9/2018 | Jeong et al. |
| 2018/0294794 A1 | 10/2018 | Liu et al. |
| 2019/0273480 A1 | 9/2019 | Lin et al. |
| 2020/0099359 A1* | 3/2020 | Shin ........................ H03F 3/189 |
| 2020/0212884 A1* | 7/2020 | Shin ........................ H03H 9/56 |
| 2020/0266795 A1 | 8/2020 | Lee et al. |
| 2021/0083643 A1* | 3/2021 | Liu ..................... H03H 9/0211 |
| 2021/0344321 A1 | 11/2021 | Shin et al. |
| 2022/0094323 A1 | 3/2022 | Zhang et al. |
| 2022/0094324 A1 | 3/2022 | Zhang et al. |

FOREIGN PATENT DOCUMENTS

| | | |
|---|---|---|
| JP | 2017-034358 | 2/2017 |
| JP | 2018-101952 | 6/2018 |
| JP | 2018-125762 | 8/2018 |
| KR | 10-2018-0008242 | 1/2018 |

OTHER PUBLICATIONS

U.S. Appl. No. 17/471,912 Published as 2022/0094323 A1, filed Sep. 19, 2021, Multi-Gradient Raised Frame in Bulk Acoustic Wave Device.

Fattinger, et al., "Optimization of Acoustic Dispersion for High Performance Thin Film BAW Resonators," 2005 IEEE Ultrasonics Symposium, pp. 1175-1178.

Kaitila, et al., "Spurious Resonance Free Bulk Acoustic Wave Resonators," 2003 IEEE Ultrasonics Symposium.

Ohara, et al., "Suppression of Acoustic Energy Leakage in FBARs with Al Bottom Electrode: FEM Simulation and Experimental Results," 2007 IEEE Ultrasonics Symposium, pp. 1657-1660.

Thalhammer, et al., "Spurious mode suppression in BAW resonators, " 2006 IEEE Ultrasonics Symposium, pp. 456-459.

* cited by examiner

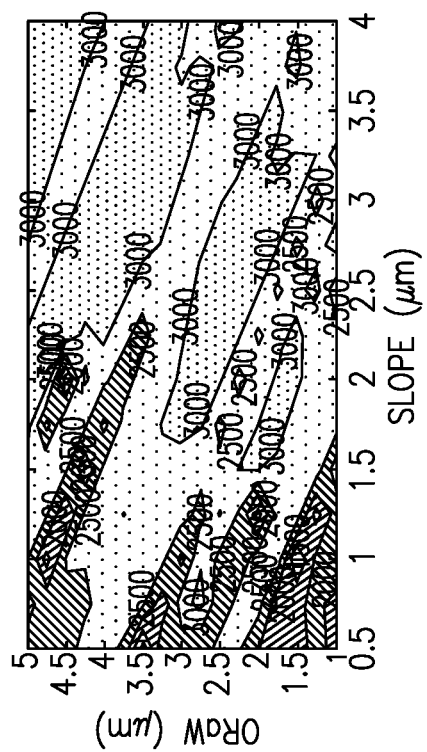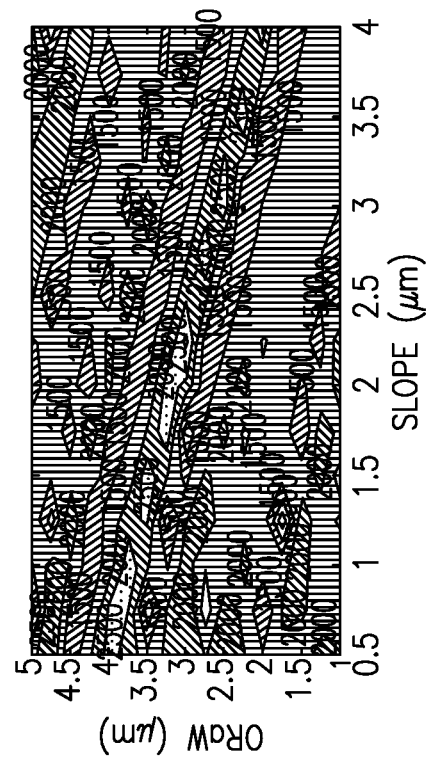
FIG.4A
FIG.4B
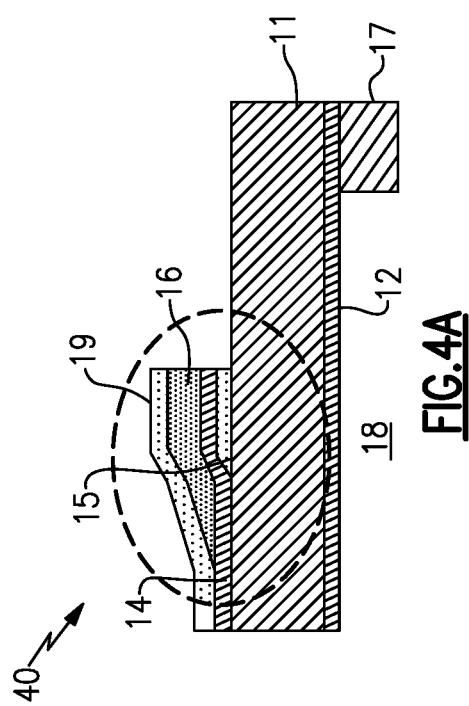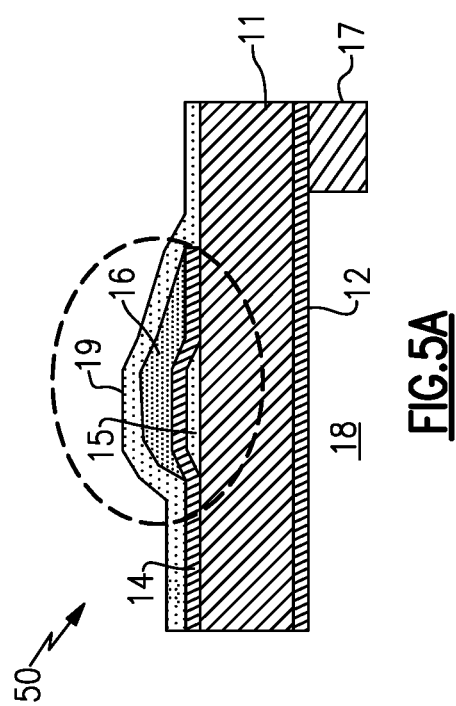
FIG.5A
FIG.5B $\alpha < 90°$

BULK ACOUSTIC WAVE DEVICE WITH RAISED FRAME STRUCTURE

CROSS REFERENCE TO PRIORITY APPLICATION

Any and all applications for which a foreign or domestic priority claim is identified in the Application Data Sheet as filed with the present application are hereby incorporated by reference under 37 C.F.R. § 1.57. This application claims the benefit of priority of U.S. Provisional Application No. 63/080,530, filed Sep. 18, 2020 and titled "BULK ACOUSTIC WAVE DEVICE WITH RAISED FRAME STRUCTURE," the disclosure of which is hereby incorporated by reference in its entirety.

BACKGROUND

Technical Field

Embodiments of this disclosure relate to acoustic wave devices and, more specifically, to bulk acoustic wave devices.

Description of Related Technology

Acoustic wave filters can be implemented in radio frequency electronic systems. For instance, filters in a radio frequency front end of a mobile phone can include one or more acoustic wave filters. A plurality of acoustic wave filters can be arranged as a multiplexer. For instance, two acoustic wave filters can be arranged as a duplexer.

An acoustic wave filter can include a plurality of acoustic resonators arranged to filter a radio frequency signal. Example acoustic wave filters include surface acoustic wave (SAW) filters and bulk acoustic wave (BAW) filters. BAW filters include BAW resonators. Example BAW resonators include film bulk acoustic wave resonators (FBARs) and solidly mounted resonators (SMRs). In BAW resonators, acoustic waves propagate in a bulk of a piezoelectric layer.

For BAW devices, achieving a high quality factor (Q) is generally desirable. However, Q can vary in BAW devices due to variations in manufacturing and/or for other reasons.

SUMMARY OF CERTAIN INVENTIVE ASPECTS

The innovations described in the claims each have several aspects, no single one of which is solely responsible for its desirable attributes. Without limiting the scope of the claims, some prominent features of this disclosure will now be briefly described.

One aspect of this disclosure is a bulk acoustic wave device with a multi-gradient raised frame. The bulk acoustic wave device includes a first electrode, a second electrode, a piezoelectric layer positioned between the first electrode and the second electrode, and a multi-gradient raised frame structure configured to cause lateral energy leakage from a main acoustically active region of the bulk acoustic wave device to be reduced. The multi-gradient raised frame structure is tapered on opposing sides. The bulk acoustic wave device is configured to generate a bulk acoustic wave.

The multi-gradient raised frame structure can surround the main acoustically active region of the bulk acoustic wave device in plan view. The multi-gradient raised frame structure can have a non-gradient portion between two gradient portions. The multi-gradient raised frame structure can consist essentially of gradient portions.

The multi-gradient raised frame structure can include a plurality of raised frame layers. The plurality of raised frame layers can include a first raised frame layer and a second raised frame layer. The second raised frame layer can extend beyond the first raised frame layer on the opposing sides. The first raised frame layer can have a lower acoustic impedance than the piezoelectric layer and/or the second raised frame layer. The first raised frame layer can be an oxide layer, and the second raised frame layer can be metallic. The first raised frame layer can be a silicon dioxide layer, and the second raised frame layer can be metallic. The first raised frame layer can be positioned between the first and second electrodes. The second electrode can be positioned between the first and second raised frame layers in some instances. The second raised frame layer can have a first taper angle on a first side and a second taper angle on a second side, in which and the first and second taper angles are in a range from 5 degrees to 45 degrees.

The multi-gradient raised frame structure can be a convex structure relative to the piezoelectric layer.

The bulk acoustic wave device can be a film bulk acoustic resonator.

Another aspect of this disclosure is an acoustic wave filter with a multi-gradient raised frame bulk acoustic wave device. The acoustic wave filter includes a bulk acoustic wave device and at least one additional acoustic wave device that are together arranged to filter a radio frequency signal. The bulk acoustic wave device includes a first electrode, a second electrode, a piezoelectric layer positioned between the first electrode and the second electrode, and a multi-gradient raised frame structure configured to cause lateral energy leakage from a main acoustically active region of the bulk acoustic wave device to be reduced. The multi-gradient raised frame structure is tapered on opposing sides.

The least one additional acoustic wave device can include a second bulk acoustic wave device that includes a second multi-gradient raised frame structure that is tapered on opposing sides.

The multi-gradient raised frame structure can include a first raised frame layer and a second raised frame layer. The first raised frame layer can include an oxide, and the second raised frame layer can be metallic. The second raised frame layer can extend beyond the first raised frame layer on the opposing sides.

Another aspect of this disclosure is a wireless communication device that includes an acoustic wave filter and an antenna operatively coupled to the acoustic wave filter. The acoustic wave filter includes a bulk acoustic wave device. The bulk acoustic wave device includes a first electrode, a second electrode, a piezoelectric layer positioned between the first electrode and the second electrode, and a multi-gradient raised frame structure configured to cause lateral energy leakage from a main acoustically active region of the bulk acoustic wave device to be reduced. The multi-gradient raised frame structure is tapered on opposing sides.

The wireless communication device can be a mobile phone. The acoustic wave filter can be included in a multiplexer.

Another aspect of this disclosure is a bulk acoustic wave device with a multi-gradient raised frame. The bulk acoustic wave device includes a first electrode, a second electrode, a piezoelectric layer positioned between the first electrode and the second electrode, and a multi-gradient raised frame structure. The multi-gradient raised frame structure includes a first raised frame layer and a second raised frame layer.

The second raised frame layer extends beyond the first raised frame layer. The second raised frame layer is tapered on opposing sides. The bulk acoustic wave device is configured to generate a bulk acoustic wave.

The second raised frame layer can extend beyond the first raised frame layer on the opposing sides, where the opposing sides include a first side toward a main acoustically active region of the bulk acoustic wave device and a second side away from the main acoustically active region.

The first raised frame layer can have a lower acoustic impedance than the piezoelectric layer. The first raised frame layer can include an oxide, and the second raised frame layer can include a metal. The second raised frame layer can include one or more of ruthenium, molybdenum, tungsten, platinum, or iridium.

The first raised frame layer can include a metal. The first raised frame layer can include a polymer.

The multi-gradient raised frame structure can have a non-gradient portion between two gradient portions. The multi-gradient raised frame structure can consist essentially of gradient portions.

The first raised frame layer can be positioned between the first electrode and the second electrode.

The second electrode can be positioned between the second raised frame layer and the first raised frame layer. The first raised frame layer can also be positioned between the piezoelectric layer and the second electrode.

The second raised frame layer can have a first taper angle on a first side and a second taper angle on a second side, and the first and second taper angles can each be greater than 5 degrees and less than 45 degrees.

The second raised frame layer can be a convex structure relative to a surface of the piezoelectric layer.

The multi-gradient raised frame structure can surround a main acoustically active region of the bulk acoustic wave device in plan view.

The bulk acoustic wave device can be a film bulk acoustic resonator.

Another aspect of this disclosure is an acoustic wave filter that includes a bulk acoustic wave device and at least one additional acoustic wave device together arranged to filter a radio frequency signal. The bulk acoustic wave device includes a first electrode, a second electrode, a piezoelectric layer positioned between the first electrode and the second electrode, and a multi-gradient raised frame structure including a first raised frame layer and a second raised frame layer. The second raised frame layer extends beyond the first raised frame layer. The second raised frame layer is tapered on opposing sides.

The at least one additional acoustic wave device can include a second bulk acoustic wave device that includes a second multi-gradient raised frame structure that is tapered on opposing sides.

Another aspect of this disclosure is a packaged radio frequency module that includes an acoustic wave filter configured to filter a radio frequency signal, a radio frequency circuit element, and a package structure enclosing the acoustic wave filter and the radio frequency circuit element. The acoustic wave filter includes a bulk acoustic wave device. The bulk acoustic wave device includes a first electrode, a second electrode, a piezoelectric layer positioned between the first electrode and the second electrode, and a multi-gradient raised frame structure including a first raised frame layer and a second raised frame layer. The second raised frame layer extends beyond the first raised frame layer. The second raised frame layer is tapered on opposing sides.

The radio frequency circuit element can be a radio frequency switch. The radio frequency circuit element can be a radio frequency amplifier.

Another aspect of this disclosure is a bulk acoustic wave device that includes a first electrode, a second electrode, a piezoelectric layer positioned between the first electrode and the second electrode, and a multi-layer raised frame structure configured to cause lateral energy leakage from a main acoustically active region of the bulk acoustic wave device to be reduced. The multi-layer raised frame structure includes a first raised frame layer embedded in the piezoelectric layer and a second raised frame layer. The first raised frame layer has a lower acoustic impedance than the piezoelectric layer. The second raised frame layer at least partly overlaps with the first raised frame layer in a raised frame region of the bulk acoustic wave device. The bulk acoustic wave device is configured to generate a bulk acoustic wave.

The second raised frame layer can be embedded in the piezoelectric layer.

The first raised frame layer can include an oxide, and the second raised frame layer can include a metal. The first raised frame layer can be a silicon dioxide layer, and the second raised frame layer can be metallic. The second raised frame layer can be embedded in the piezoelectric layer.

The multi-layer raised frame structure can be a multi-gradient raised frame structure. The second raised frame layer can extend beyond the first raised frame layer on opposing sides of the multi-layer raised frame structure. The multi-gradient raised frame structure can have a non-gradient portion between two gradient portions. The second raised frame layer can have a first taper angle on a first side and a second taper angle on a second side, and the first and second taper angles can each be greater than 5 degrees and less than 45 degrees.

The multi-layer raised frame structure can surround the main acoustically active region of the bulk acoustic wave device in plan view.

The bulk acoustic wave device can be a film bulk acoustic resonator.

Another aspect of this disclosure is an acoustic wave filter comprising that includes a bulk acoustic wave device and the at least one additional acoustic wave device together arranged to filter a radio frequency signal. The bulk acoustic wave device includes a first electrode, a second electrode, a piezoelectric layer positioned between the first electrode and the second electrode, and a multi-layer raised frame structure including a first raised frame layer and a second raised frame layer. The first raised frame layer is embedded in the piezoelectric layer and has a lower acoustic impedance than the piezoelectric layer. The second raised frame layer at least partly overlaps with the first raised frame layer.

The at least one additional acoustic wave device can include a second bulk acoustic wave device that includes a raised frame layer embedded in a piezoelectric layer of the second bulk acoustic wave device.

The multi-layer raised frame structure can be a multi-gradient raised frame structure. The second raised frame layer can have a first taper angle on a first side and a second taper angle on a second side, and the first and second taper angles can each be greater than 5 degrees and less than 45 degrees. The first raised frame layer can be an oxide, and the second raised frame layer can be metallic. The first raised frame layer can be a silicon dioxide layer.

Another aspect of this disclosure is a packaged radio frequency module that includes an acoustic wave filter, a radio frequency circuit element, and a package structure enclosing the acoustic wave filter and the radio frequency circuit element. The acoustic wave filter includes a bulk acoustic wave device. The bulk acoustic wave device includes a first electrode, a second electrode, a piezoelectric layer positioned between the first electrode and the second electrode, and a multi-layer raised frame structure including a first raised frame layer and a second raised frame layer. The first raised frame layer is embedded in the piezoelectric layer and has a lower acoustic impedance than the piezoelectric layer. The second raised frame layer at least partly overlaps with the first raised frame layer.

The radio frequency circuit element can be a radio frequency switch. The radio frequency circuit element can be a radio frequency amplifier.

For purposes of summarizing the disclosure, certain aspects, advantages and novel features of the innovations have been described herein. It is to be understood that not necessarily all such advantages may be achieved in accordance with any particular embodiment. Thus, the innovations may be embodied or carried out in a manner that achieves or optimizes one advantage or group of advantages as taught herein without necessarily achieving other advantages as may be taught or suggested herein.

The present disclosure relates to U.S. patent application Ser. No. 17/471,604, titled "BULK ACOUSTIC WAVE DEVICE WITH MULTI-GRADIENT RAISED FRAME," filed on even date herewith, the entire disclosure of which is hereby incorporated by reference herein. The present disclosure also relates to U.S. patent application Ser. No. 17/471,912, titled "MULTI-GRADIENT RAISED FRAME IN BULK ACOUSTIC WAVE DEVICE," filed on even date herewith, the entire disclosure of which is hereby incorporated by reference herein.

BRIEF DESCRIPTION OF THE DRAWINGS

Embodiments of this disclosure will now be described, by way of non-limiting example, with reference to the accompanying drawings.

FIG. 4A is a cross sectional view of a portion of a BAW device with a single gradient raised frame structure. FIG. 4B shows simulation results for the BAW device of FIG. 4A.

FIG. 5A is a cross sectional view of a BAW device with a dual gradient raised frame structure. FIG. 5B shows simulation results for the BAW device of FIG. 5A.

DETAILED DESCRIPTION OF CERTAIN EMBODIMENTS

Figure 1:
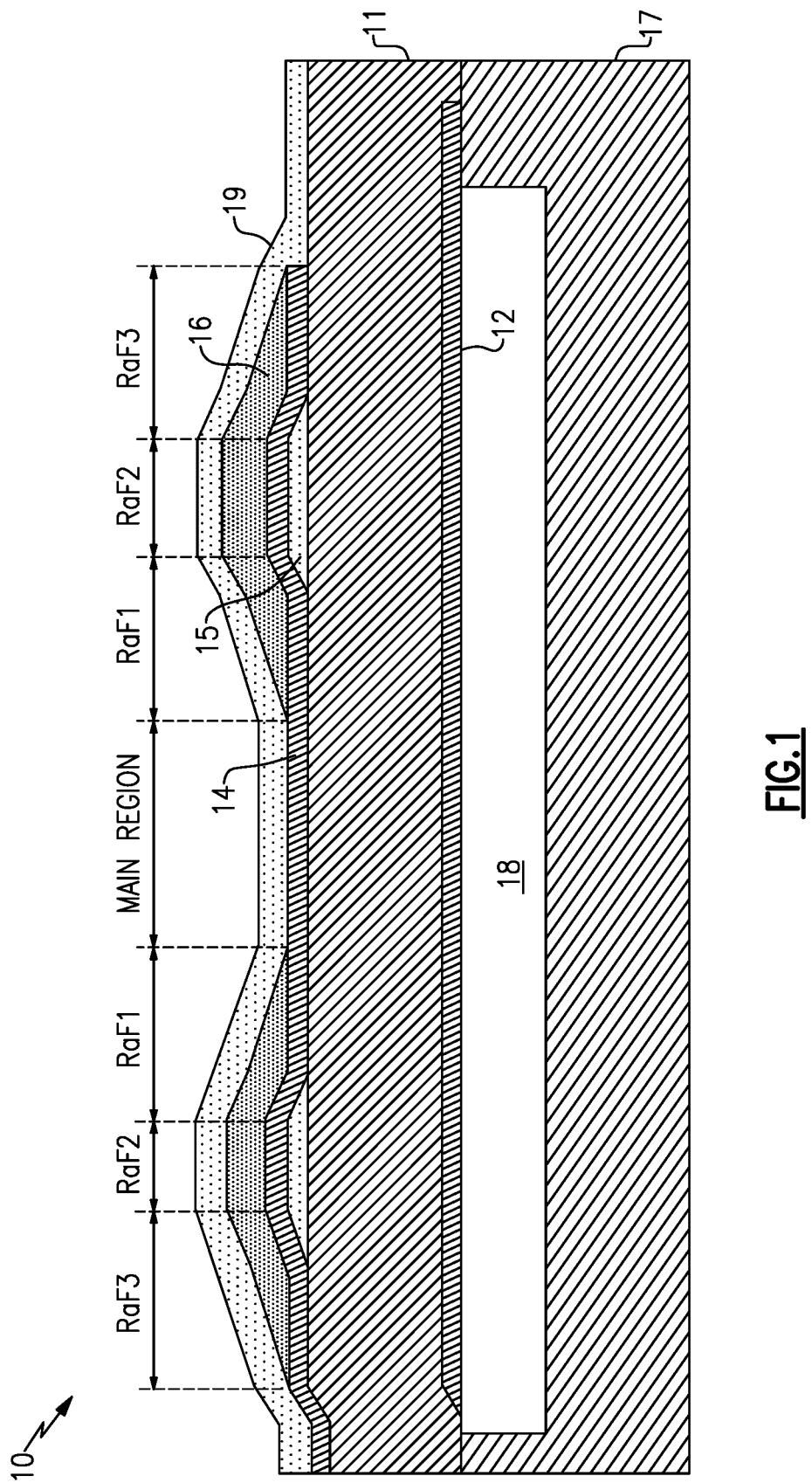
FIG. 1 is a schematic cross-sectional view of a bulk acoustic wave (BAW) device with a dual gradient raised frame structure according to an embodiment.

The following description of certain embodiments presents various descriptions of specific embodiments. However, the innovations described herein can be embodied in a multitude of different ways, for example, as defined and covered by the claims. In this description, reference is made to the drawings where like reference numerals can indicate identical or functionally similar elements. It will be understood that elements illustrated in the figures are not necessarily drawn to scale. Moreover, it will be understood that certain embodiments can include more elements than illustrated in a drawing and/or a subset of the elements illustrated in a drawing. Further, some embodiments can incorporate any suitable combination of features from two or more drawings.

BAW devices can include raised frame structures. A raised frame structure can reduce lateral energy leakage from a main acoustically active region of the bulk acoustic wave device.

Aspects of this disclosure relate to bulk acoustic wave (BAW) devices with a multi-gradient raised frame structure. Multi-gradient raised frame structures disclosed herein can achieve high quality factor (Q) stability and reduce Q sensitivity of raised frame technology. Q of a BAW device can be improved by a combination of a multi-layer raised frame structure and a gradient raised frame. This Q can be a Qp of the BAW device, where Qp is a quality factor at anti-resonance. Dual gradient raised frame structures disclosed herein can improve Q stability and also reduce sensitivity of the raised frame on Q. A dual gradient raised frame structure may compensate for energy reflection from leakage relative to a single gradient raised frame structure. Accordingly, a dual gradient raised frame structure can provide better performance than a single gradient raised frame structure in certain applications.

Embodiments disclosed herein relate to BAW devices that include a multi-layer raised frame structure with a plurality of gradients. The multi-layer raised frame structure can include a first raised frame layer positioned between a lower electrode and an upper electrode of a BAW device. The multi-layer raised frame structure can also include a second raised frame layer positioned over the first raised frame layer. The second raised frame layer can extend beyond the first raised frame layer. The second raised frame layer can be tapered on opposing sides where the second raised frame layer extends beyond the first raised frame layer. Tapered portions of the second raised frame layer can have a taper angle that is less than 90 degrees. For example, the taper angle can be less than 45 degrees. The multi-layer raised frame structure can have a convex structure relative to a surface of a piezoelectric layer and/or an electrode layer. The multi-layer raised frame structure can have a convex structure relative to an acoustic reflector, such as an air cavity. The multi-layer raised frame structure can form a dome shaped structure. The multi-layer raised frame structure can surround a main acoustically active region of a BAW device in plan view.

The first raised frame layer can have a lower acoustic impedance than the piezoelectric layer of a BAW device. The first raised frame layer can have a lower acoustic impedance than the lower electrode layer and the upper electrode layer of a BAW device. The first raised frame layer can reduce a coupling coefficient. The first raised frame layer can be an oxide. The first raised frame layer can be a metal. The first raised frame layer can be a polymer. The first raised frame layer can include one or more of an oxide, a metal, or a polymer. The first raised frame layer can include, for example, silicon dioxide ($SiO_2$) layer, silicon nitride (SiN) layer, silicon carbide (SiC) layer, or any other suitable low acoustic impedance material. Because $SiO_2$ is already used in a variety of bulk acoustic wave devices, a $SiO_2$ first raised frame layer can be relatively easy to manufacture. While the first raised frame layer may be referred to as an oxide in certain instances, the first raised frame layer can include any suitable material for a particular application.

The second raised frame layer can be a relatively high acoustic impedance. For instance, the second raised frame layer can include molybdenum (Mo), tungsten (W), ruthenium (Ru), platinum (Pt), iridium (Ir), the like, or any suitable alloy thereof. The second raised frame layer can be a metal layer. Alternatively, the second raised frame layer can be a suitable non-metal material with a relatively high acoustic impedance. The acoustic impedance of the second raised frame layer can be similar to or higher than the acoustic impedance of an electrode layer of the BAW device. In some instances, the second raised frame layer can be of the same material as an electrode layer of the BAW device. The second raised frame layer can have a relatively high density. While the second raised frame layer may be referred to as a metal layer or a metallic layer in certain instances, the second raised frame layer can include any suitable material for a particular application.

Example BAW devices with multi-gradient raised frame structures will now be discussed. Any suitable principles and advantages of these BAW devices can be implemented together with each other.

Figure 2A:
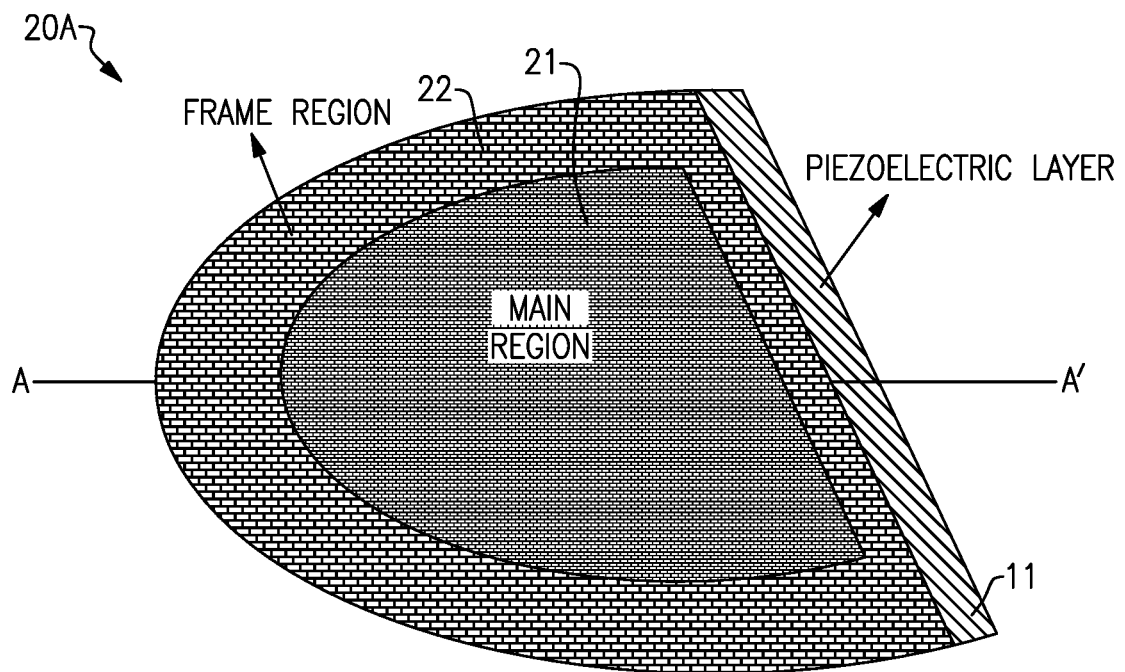
FIG. 2A is a plan view of an example BAW device with a frame region surrounding a main acoustically active region.
Figure 2B:
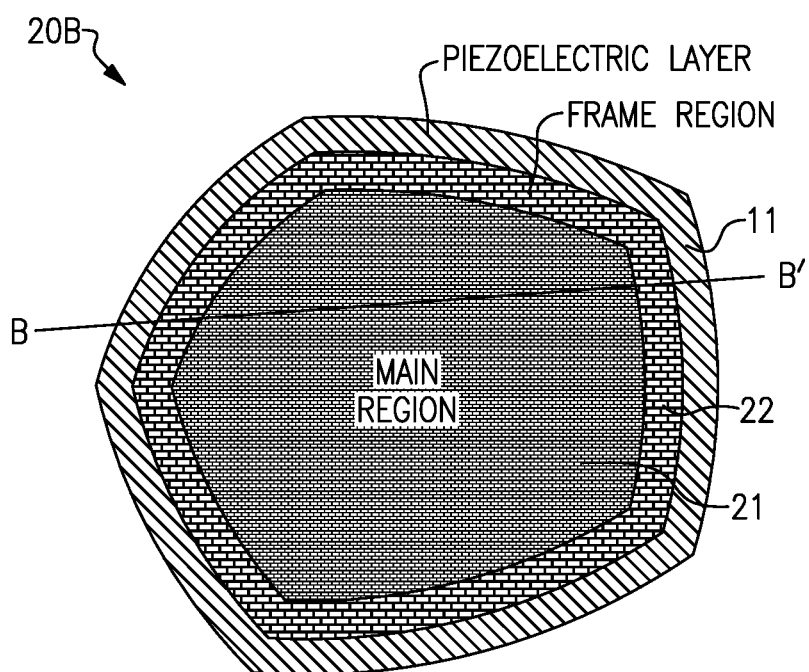
FIG. 2B is a plan view of another BAW device with a frame region surrounding a main acoustically active region.

FIG. 1 is a schematic cross-sectional view of a BAW device 10 with a dual gradient raised frame structure according to an embodiment. The BAW device 10 can generate a bulk acoustic wave. The BAW device 10 can be a BAW resonator. The illustrated BAW device 10 includes a main acoustically active region Main Region and a frame region on opposing sides of the main acoustically active region in the illustrated cross-sectional view. Both the main acoustically active region Main and the frame region are included over the acoustic reflector in the BAW device 10. There can be a significant (e.g., exponential) fall off of acoustic energy in the piezoelectric layer for a main mode in the frame region relative to the main acoustically active region. In the frame region, there is a first gradient region RaF1, a non-gradient region RaF2, and a second gradient region RaF3. The first and second gradient regions RaF1 and RaF3, respectively, are both included over the acoustic reflector. As shown in FIG. 1, the first and second gradient regions RaF1 and RaF3, respectively, are over the air cavity 18. The main acoustically active region can be significantly larger than the frame region. FIGS. 2A and 2B can show the relative sizes of the main acoustically active region and the frame region more to scale than the cross-sectional view of FIG. 1.

As illustrated, the BAW device 10 includes a piezoelectric layer 11, a first electrode 12, a second electrode 14, a first raised frame layer 15, a second raised frame layer 16, a support substrate 17, an acoustic reflector such as an air cavity 18, and a passivation layer 19.

The piezoelectric layer 11 is positioned between the first electrode 12 and the second electrode 14. The piezoelectric layer 11 can be an aluminum nitride (AlN) layer. The piezoelectric layer 11 can be any other suitable piezoelectric layer. In the main acoustically active region Main Region, piezoelectric layer 11 overlaps with and is in physical contact with both the first electrode 12 and the second electrode 14 over the air cavity 18. The main acoustically active region Main Region is also free from the first and second raised frame layers 15 and 16, respectively.

The first electrode 12 can have a relatively high acoustic impedance. For example, the first electrode 12 can include molybdenum (Mo), tungsten (W), ruthenium (Ru), chromium (Cr), iridium (Jr), platinum (Pt), Ir/Pt, or any suitable alloy and/or combination thereof. Similarly, the second electrode 14 can have a relatively high acoustic impedance. The second electrode 14 can include Mo, W, Ru, Ir, Cr, Pt, Ir/Pt, or any suitable alloy and/or combination thereof. The second electrode 14 can be formed of the same material as the first electrode 14 in certain instances. The first electrode 12 can be referred to as a lower electrode. The second electrode 14 can be referred to as an upper electrode.

The first raised frame layer 15 can have a lower acoustic impedance than the piezoelectric layer 11 of the BAW device 10. The first raised frame layer 15 can have a lower acoustic impedance than the first electrode 12 and the second electrode layer 14 of a BAW device 10. The first raised frame layer 15 can be an oxide, such as a silicon oxide. Such a first raised frame layer 15 can be referred to as an oxide raised frame layer. The first raised frame layer 15 can be a dielectric layer. The first raised frame 15 layer can include a metal. The first raised frame 15 layer can be a polymer. The first raised frame layer 15 can include one or more of an oxide, a metal, or a polymer. The first raised frame layer 15 can include, for example, a $SiO_2$ layer, a SiN layer, a SiC layer, or any other suitable low acoustic impedance material. Because $SiO_2$ is already used in a variety of bulk acoustic wave devices, a $SiO_2$ first raised frame layer 15 can be relatively easy to manufacture.

The second raised 16 frame layer can be a relatively high acoustic impedance material. For instance, the second raised frame 16 layer can include Mo, W, Ru, Jr, Cr, Pt, the like, or any suitable alloy thereof. The second raised 16 frame layer can be a metallic layer. In such embodiments, the second raised frame layer 16 can be referred to as a metal raised frame layer. Alternatively, the second raised frame layer 16 can be a suitable non-metal material with a relatively high acoustic impedance. The acoustic impedance of the second raised frame layer 16 can be similar to or greater than the acoustic impedance of an electrode 12 and/or 14 of the BAW device 10. In some instances, the second raised frame layer 16 can be of the same material as an electrode 12 and/or 14 of the BAW device 10. The second raised frame layer 16 can have a relatively high density. The density of the second raised frame layer 16 can be similar to or heavier than the density of an electrode 12 and/or 14 of the BAW device 10.

In certain embodiments, the first raised frame layer 15 is an oxide layer (e.g., a silicon dioxide layer) and the second raised frame layer 16 is a metallic layer. In at least some such embodiments, the first raised frame layer 15 can be of the same material as the passivation layer 19. The second raised frame layer 16 can be of the same material as at least one of the electrodes 12 and 14 in some such instances.

In FIG. 1, the first raised frame layer 15 and the second raised frame layer 16 are both substantially parallel to the piezoelectric layer 11 in the non-gradient region RaF2 of the frame region. The illustrated second raised frame layer 16 is tapered and extends beyond the first raised frame layer 15 in the first and second gradient regions RaF1 and RaF3, respectively, of the frame region. The first gradient region RaF1 and the second gradient region RaF3 are on opposing sides of the raised frame structure. In the BAW device 10 shown in FIG. 1, the opposing sides are an inner side of the raised frame structure that extends toward the main acoustically active region Main Region and an outer side away from the main acoustically active region Main Region. The outer side is at or near an edge of the air cavity 18 in FIG. 1. The second raised frame layer 16 is a continuous layer extending from the first gradient region RaF1 to the second gradient region RaF3 in the BAW device 10. The second raised frame layer 16 has a non-gradient portion in the non-gradient region RaF2 and gradient portions in the gradient regions RaF1 and RaF3 in FIG. 1.

Figure 21:
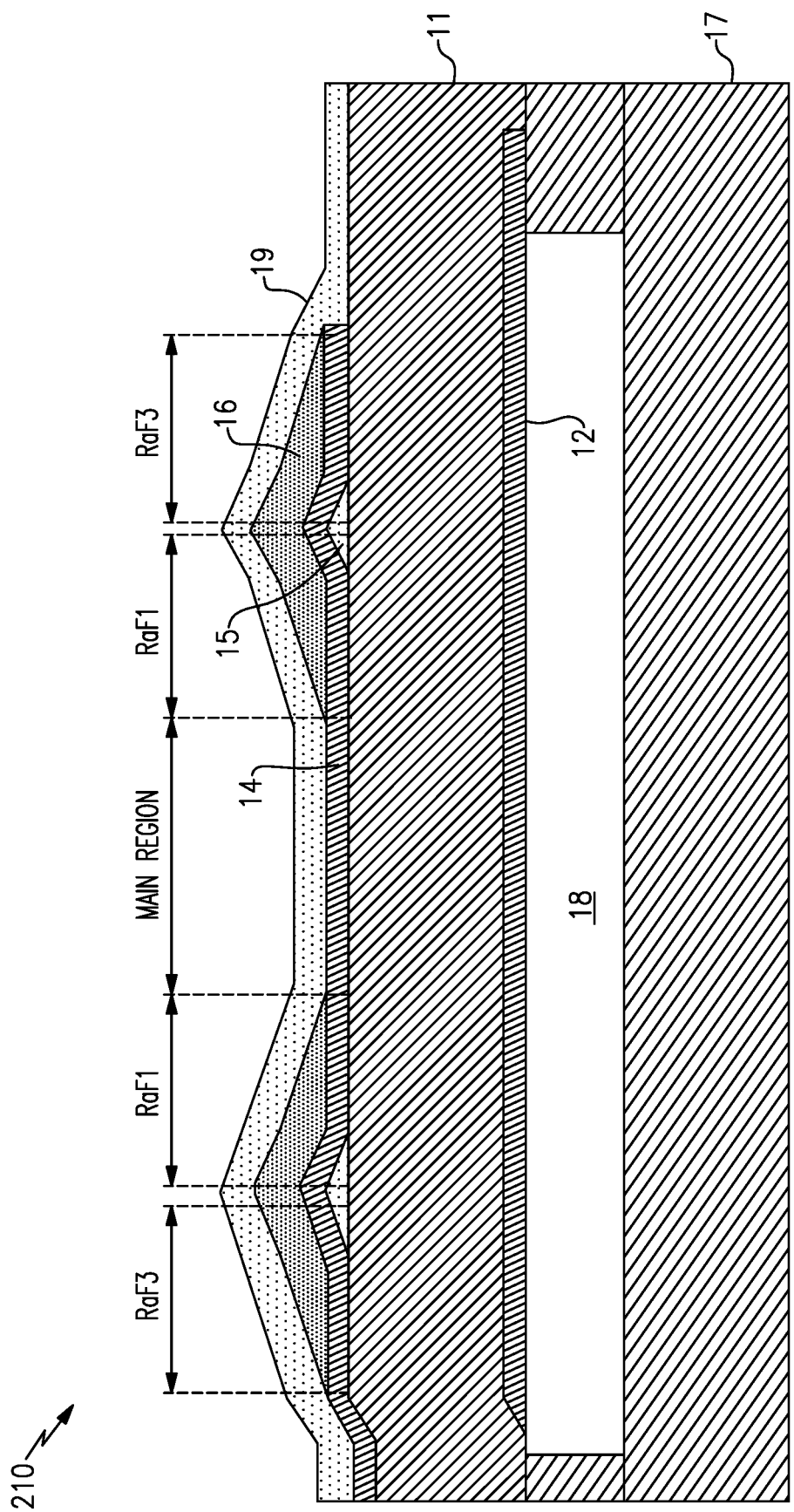
FIG. 21 illustrates a schematic cross-sectional view of a BAW device according to another embodiment.

Although embodiments disclosed herein may include dual gradient raised frame structures, any suitable principles and advantages disclosed herein can be implemented in BAW devices with three or more gradient regions. While the frame region of FIG. 1 includes two gradient regions RaF1 and RaF3 and a non-gradient region RaF2 between the gradient regions RaF1 and RaF3, some other multi-gradient raised frame structures (e.g., raised frame structures with relatively narrow width) can include gradient regions without a non-gradient region. Accordingly, a multi-gradient raised frame structure can consist of or consist essentially of gradient regions. An example of such a BAW device is shown in FIG. 21.

Any suitable principles and advantages disclosed herein can be applied to floating raised frame structures where a raised frame structure is at a floating voltage level. The floating raised frame structure can be electrically isolated from the electrodes of the BAW device (e.g., by a dielectric material).

A frame region can surround the main acoustically active region of a BAW device in plan view. FIG. 2A shows an example frame region 22 surrounding a main acoustically active region 21 in plan view. The cross-sectional views in the drawings can be along the line A-A' in FIG. 2A in certain embodiments. A BAW device 20A shown in FIG. 2A has a semi-circular or semi-elliptical shape in plan view. The frame region 22 shown in FIG. 2A can include any of the gradient frame regions and non-gradient frame regions shown in any of the cross-sectional diagrams of the figures. The frame region 22 can also include one or more recessed frame regions. A recessed frame region can be located between a raised frame region and a central part of the main acoustically active region 21. In a recessed frame region, there can be less mass loading than in the main acoustically active region 21.

A BAW device in accordance with any suitable principles and advantages disclosed herein can alternatively have any other suitable shape in plan view, such as a quadrilateral shape, a quadrilateral shape with curved sides, a pentagon shape, a pentagon shape with curved sides, or the like. For example, FIG. 2B shows another example of another BAW device 20B with a frame region 22 surrounding a main acoustically active region 21 in plan view. The BAW device 20B shown in FIG. 2B has a pentagon shape with rounded sides in plan view. The cross-sectional views in the drawings can be along the line B-B' in FIG. 2B in certain embodiments. The frame region 22 shown in FIG. 2B can include any of the gradient frame regions and non-gradient frame regions shown in any of the cross-sectional diagrams of the figures. The frame region 22 of the BAW device 20B can also include one or more recessed frame regions located between a raised frame region and a central part of the main acoustically active region 21.

Figure 3A:
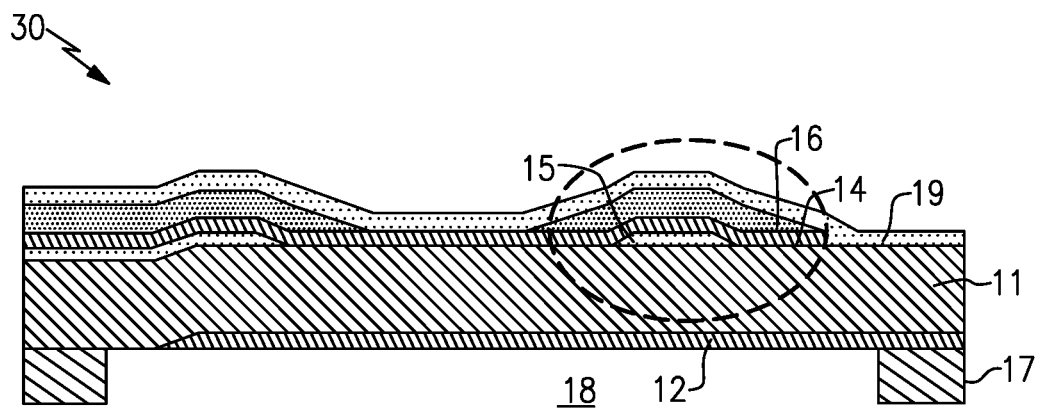
FIG. 3A is a cross sectional view of a BAW device with a dual gradient raised frame structure.
Figure 3B:
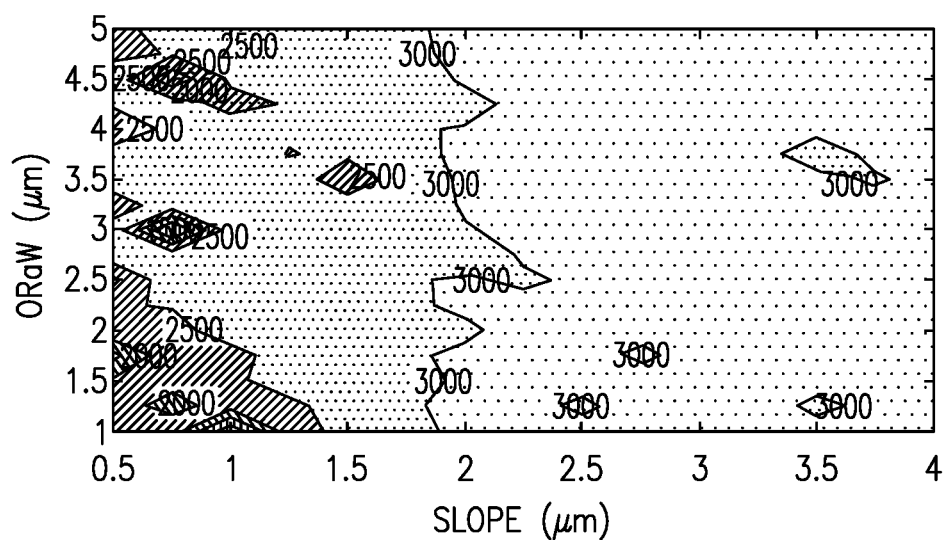
FIG. 3B shows simulation results for the BAW device of FIG. 3A.

FIG. 3A shows a cross sectional view of a BAW device 30 with a dual gradient raised frame structure. FIG. 3B shows simulation results for the BAW device 30 of FIG. 3A where mirrored versions of the circled dual gradient raised frame structure are included on opposing sides of the cross-sectional view of the BAW device 30. The simulation results are for Q as slope and thickness of a silicon dioxide first raised frame layer 15 are varied. The simulation results show a large region where a high Q value is achieved. These simulation results indicate that a stable Q can be achieved in the presence of process changes and/or process variations.

For example, the simulation results indicate that thickness of the first raised frame layer 15 of FIG. 3A can be adjusted without a significant impact on Q.

FIG. 4A shows a cross sectional view of a portion of a BAW device 40 with a single gradient raised frame structure circled. In the BAW device 40, the single gradient on an inner side of the raised frame structure that extends to the main acoustically active region. The outer side of the raised frame structure of the BAW device 40 near an edge of the air cavity 18 does not include a gradient. FIG. 4B shows simulation results for the BAW device 40 of FIG. 4A where mirrored versions of the circled single gradient raised frame structure are included on opposing sides of the cross-section of the BAW device 40. The simulation results are for Q as slope and thickness of a silicon dioxide first raised frame layer 15 are varied. The simulation results indicate that the simulated BAW device 40 can achieve a high Q. These simulation results also indicate a less stable Q compared to the BAW device 30 of FIG. 3A as device parameters, such as thickness of the first raised frame layer 15, change.

FIG. 5A shows a cross sectional view of a portion of a BAW device 50 with a raised frame structure without the second raised frame layer 16 extending beyond the first raised frame layer 15 toward the main acoustically active region circled. FIG. 5B shows simulation results for the BAW device 50 of FIG. 5A where mirrored versions of the circled raised frame structure are included on opposing sides of the cross-section of the BAW device 50. The simulation results are for Q as slope and thickness of a silicon dioxide first raised frame layer 15 are varied. The simulation results indicate that the simulated BAW device 50 has less desirable Q performance relative to the BAW devices 30 and 40 corresponding to the simulation results in FIGS. 3B and 4B, respectively. Having the second raised frame layer 16 extend beyond the first raised frame layer on opposing sides of a raised frame structure can be desirable.

Figure 6:
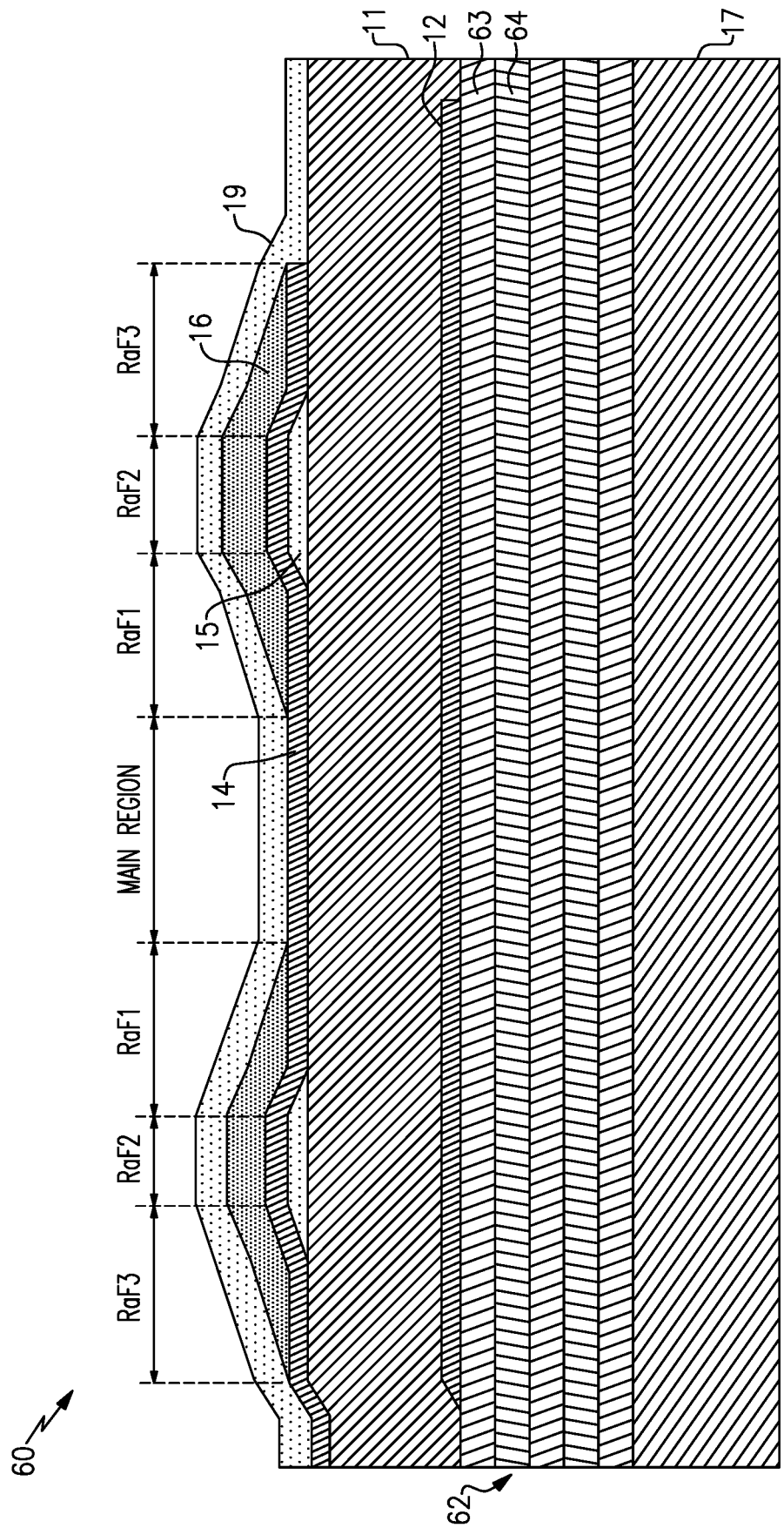
FIG. 6 is a cross sectional view of a solidly mounted resonator (SMR) BAW device with a dual gradient raised frame structure according to an embodiment.

The BAW device 10 of FIG. 1 is a film bulk acoustic resonator (FBAR). The principles and advantages disclosed herein can be applied to other BAW devices. FIG. 6 illustrates a solidly mounted resonator (SMR) BAW device 60 with a dual gradient raised frame structure. The SMR BAW device 60 includes a solid acoustic mirror 62 in place of an air cavity as an acoustic reflector. The solid acoustic mirror 62 is an acoustic Bragg reflector. The solid acoustic mirror 62 includes alternating low acoustic impedance layers 63 and high acoustic impedance layers 64. As one example, the solid acoustic mirror 62 can include alternating silicon dioxide layers as low acoustic impedance layers 63 and tungsten layers as high acoustic impedance layers 64. Any suitable principles and advantages disclosed herein can be applied to SMR BAW devices.

FIGS. 7 to 21 are cross-sectional views of embodiments of BAW devices with multi-gradient raised frame structures. In these drawings, a support substrate under an acoustic reflector (e.g., air cavity) is not shown although the support substrate is included below the acoustic reflector in these embodiments. Any suitable combination of features of these embodiments can be implemented together with each other and/or other embodiments disclosed herein.

Figure 7:
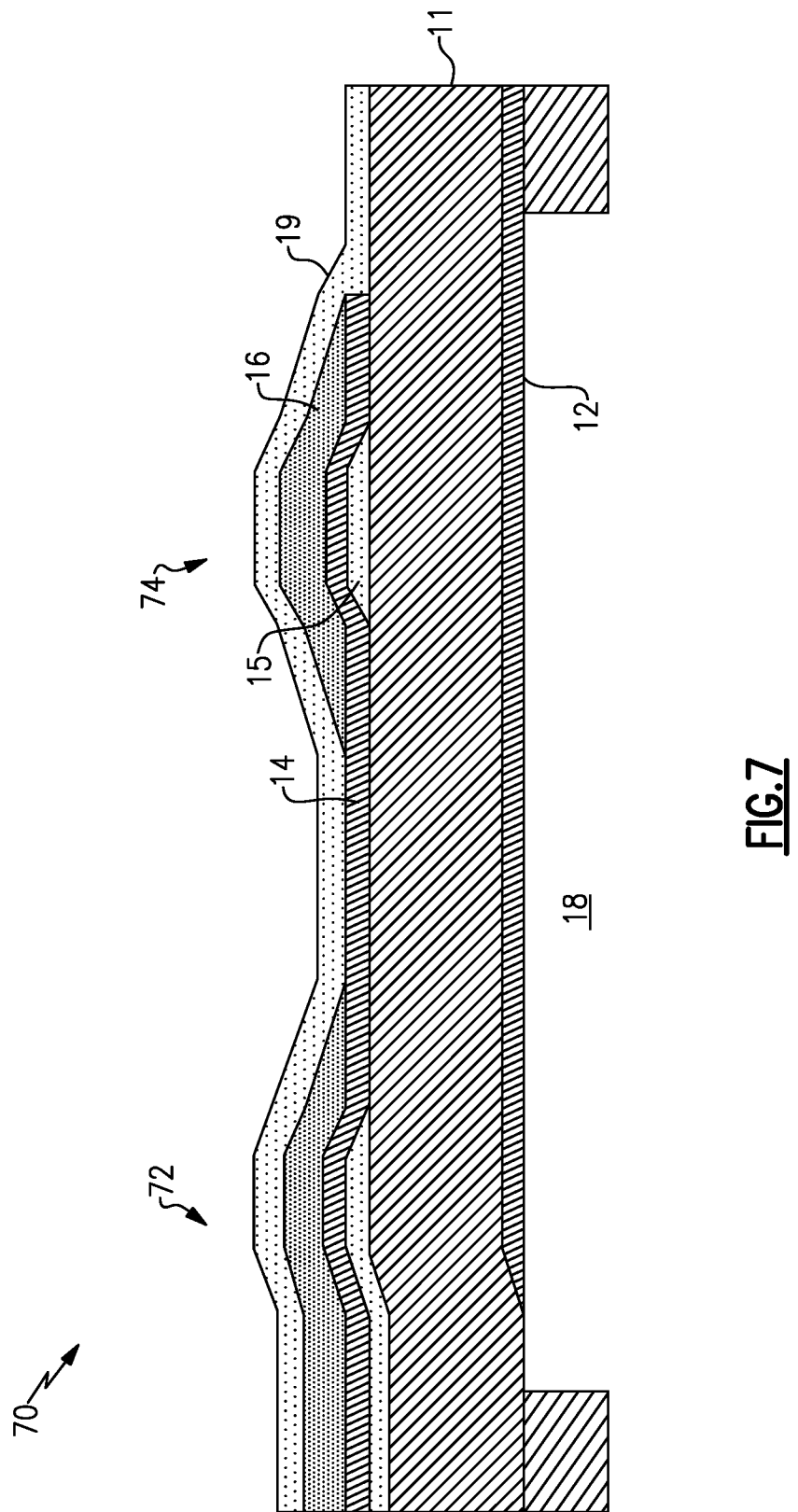
FIG. 7 is a cross-sectional view of a BAW device with a multi-gradient raised frame structure according to an embodiment.

FIG. 7 is a schematic cross-sectional view of a BAW device 70 with a multi-gradient raised frame structure according to an embodiment. As shown in FIG. 7, the second raised frame layer 16 can extend beyond the first raised frame layer 15 on only one side of the first raised frame layer 15 for a first part 72 of a BAW device 70 and extend beyond both sides of the first raised frame layer 15 for a second part 74 of the BAW device 70. The first part 72 and the second part 74 of the BAW device 70 can be on opposite sides of the main acoustically active region as shown in FIG. 7.

Figure 8:
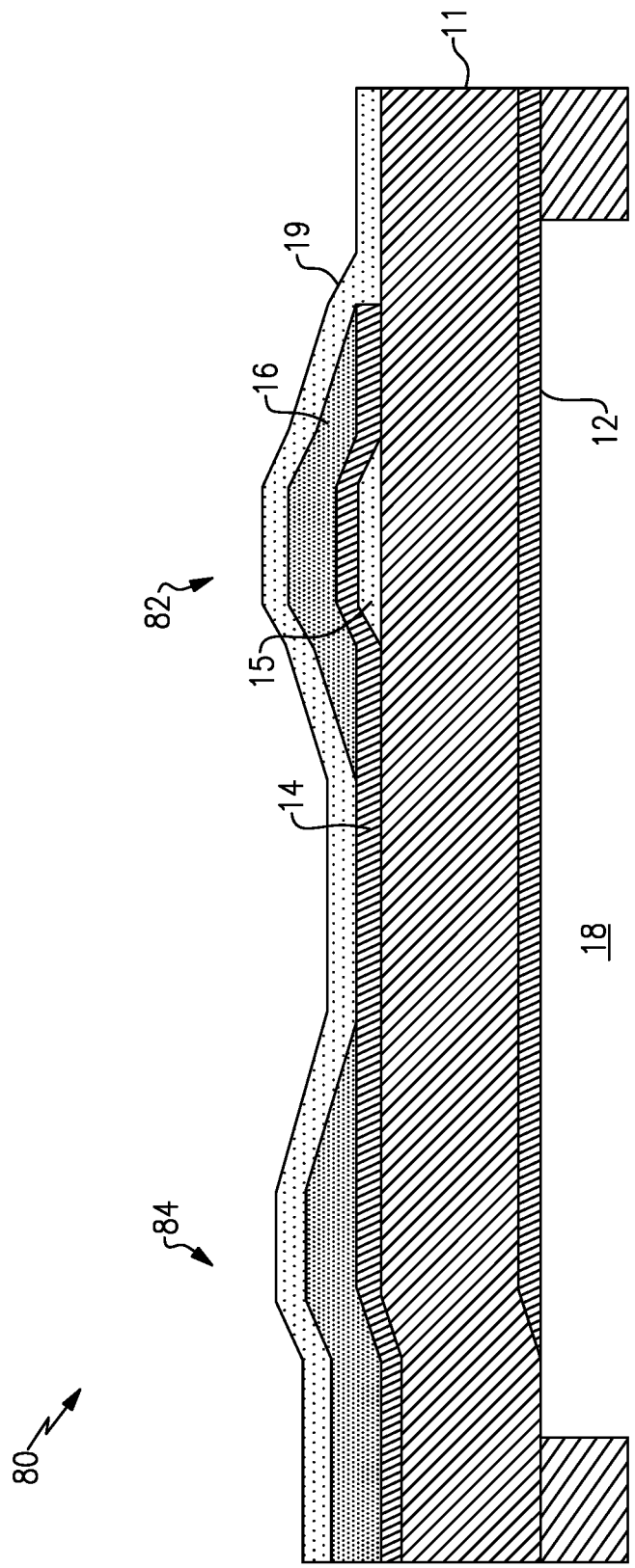
FIG. 8 is a cross-sectional view of a BAW device according to another embodiment.

FIG. 8 is a schematic cross-sectional view of a BAW device 80 with a multi-gradient raised frame structure according to an embodiment. In FIG. 8, the first raised frame layer 15 is included on one side of the BAW device in the illustrated schematic cross-sectional view. As illustrated, the multi-gradient raised frame structure of the BAW device 80 includes a multi-layer part 82 and single layer part 84. The BAW device 80 is an example of a multi-gradient raised frame BAW device where a raised frame layer (i.e., the first raised frame layer 15 pf the BAW device 80) is included along only part of the main acoustically active region of the BAW device.

Figure 9:
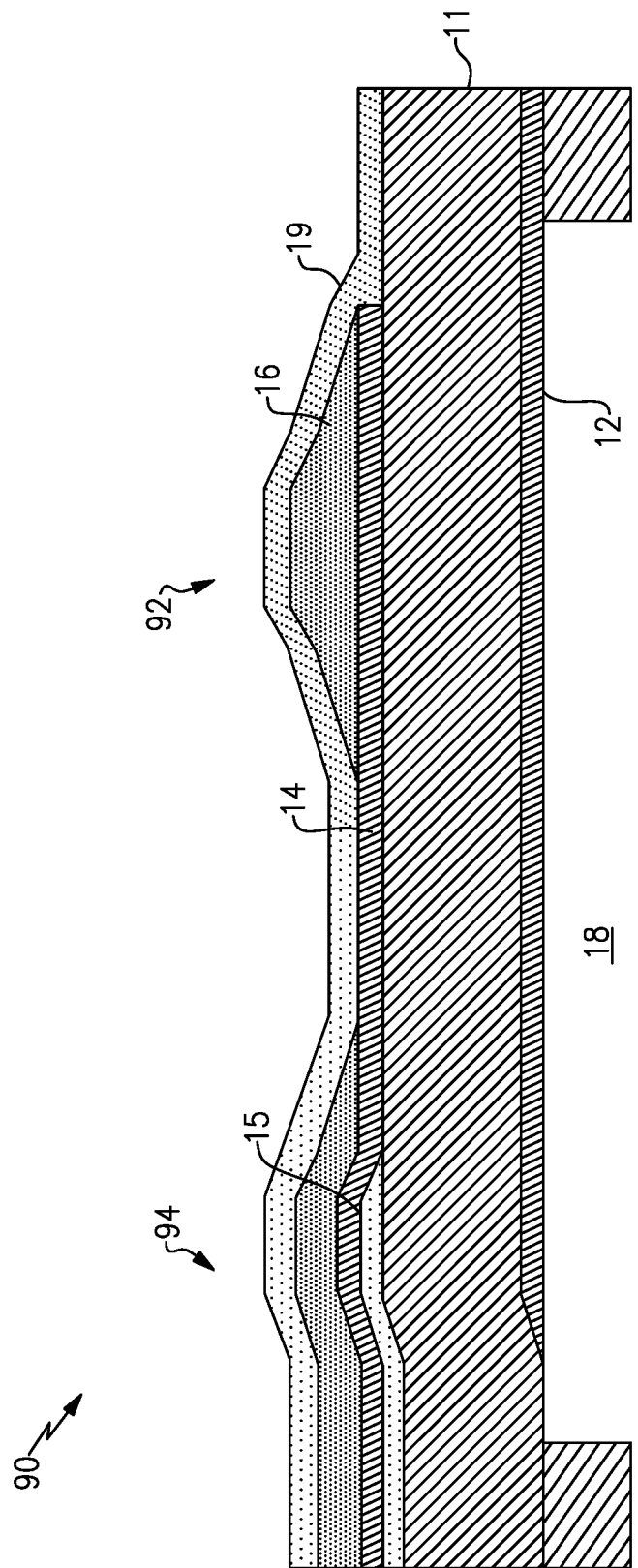
FIG. 9 is a cross-sectional view of a BAW device according to another embodiment.

FIG. 9 is a schematic cross-sectional view of a BAW device 90 with a multi-gradient raised frame structure according to an embodiment. In FIG. 9, one side of the cross-sectional view includes a single raised frame layer in a first part 92 of the BAW device 90 and a second side of the cross-sectional view includes a dual layer raised frame layer in a second part 94 of the BAW device 90 where the second layer extends beyond the first layer on one side. The raised frame structure of the BAW device 90 includes a multi-layer part 94 and single layer part 92. In multi-layer part 94 of the multi-gradient raised frame structure, the second raised frame layer 16 extends beyond first raised frame layer 15 on only one side. In the single layer part 92 of the multi-gradient raised frame structure, a portion of the second raised frame layer 16 is thicker than in the multi-layer part 94 of the multi-gradient raised frame structure in the BAW device 90. In the non-gradient region of the single layer part 92, the second raised frame layer 16 is thicker than in the multi-layer part 94.

Figure 10:
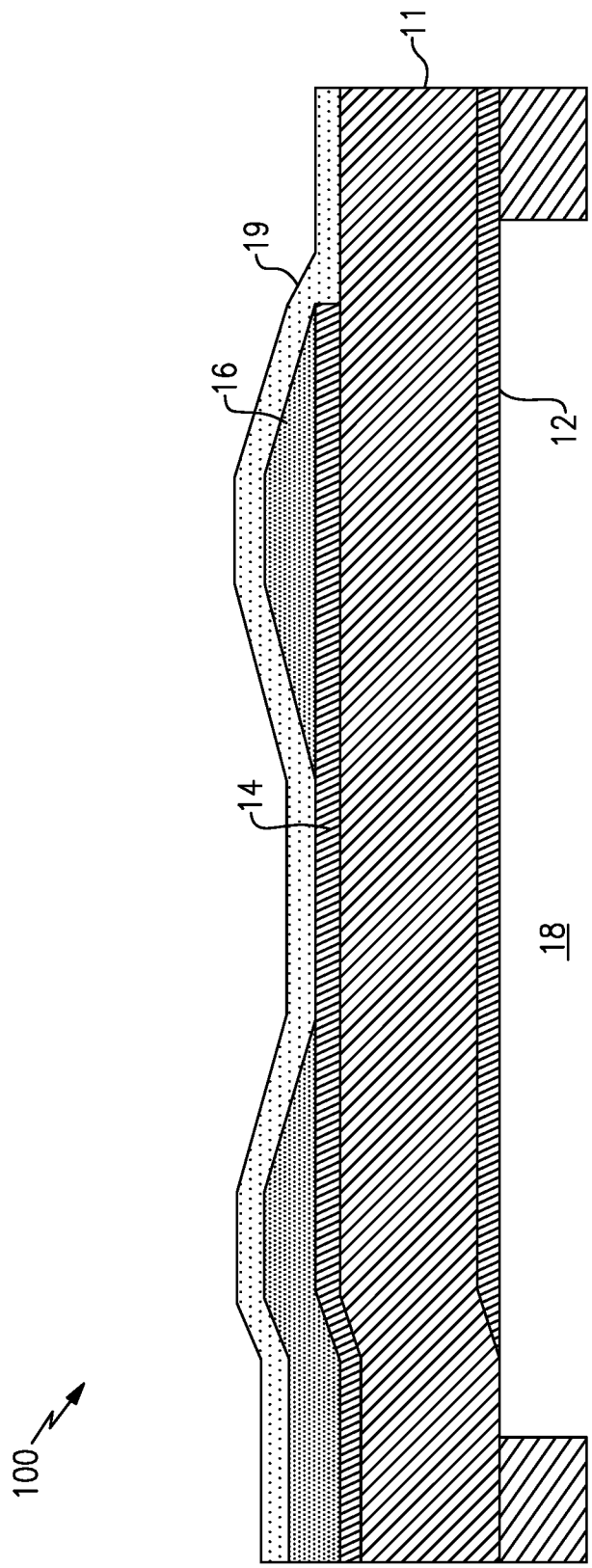
FIG. 10 is a cross-sectional view of a BAW device with a single raised frame layer according to an embodiment.
Figure 11:
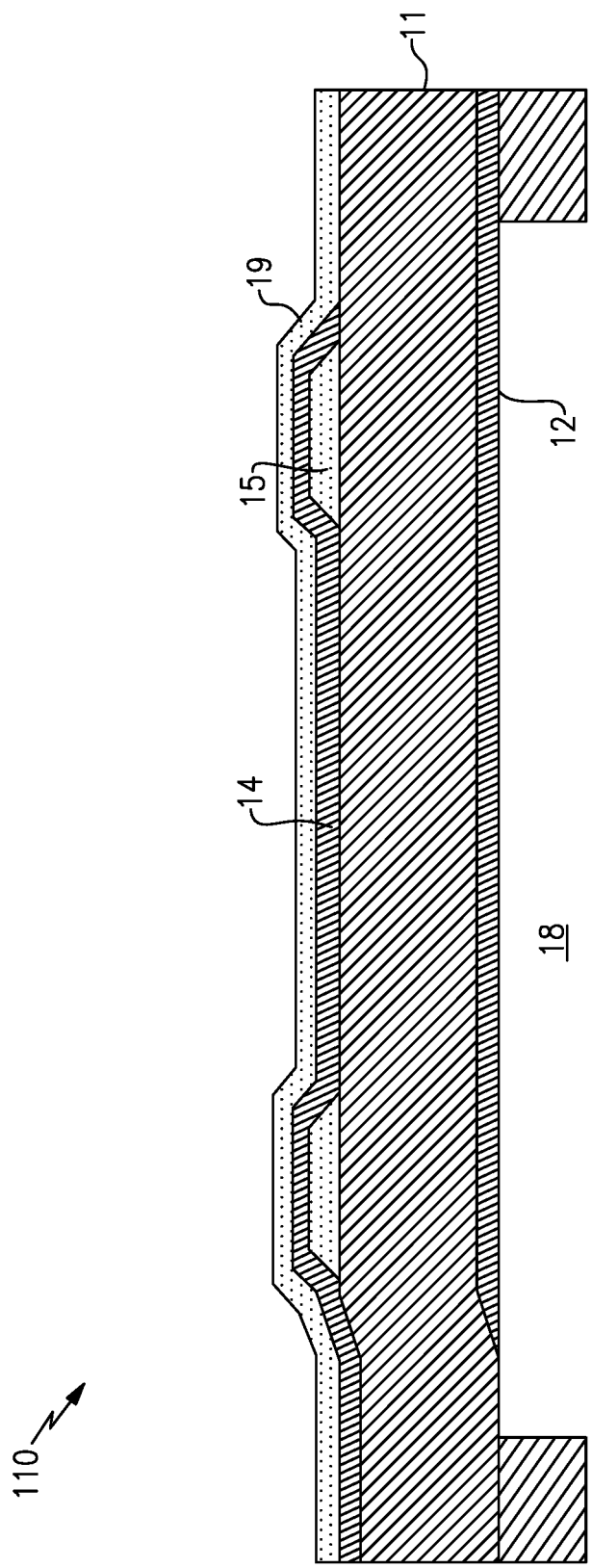
FIG. 11 is a cross-sectional view of a BAW device with a single raised frame layer according to another embodiment.
Figure 12:
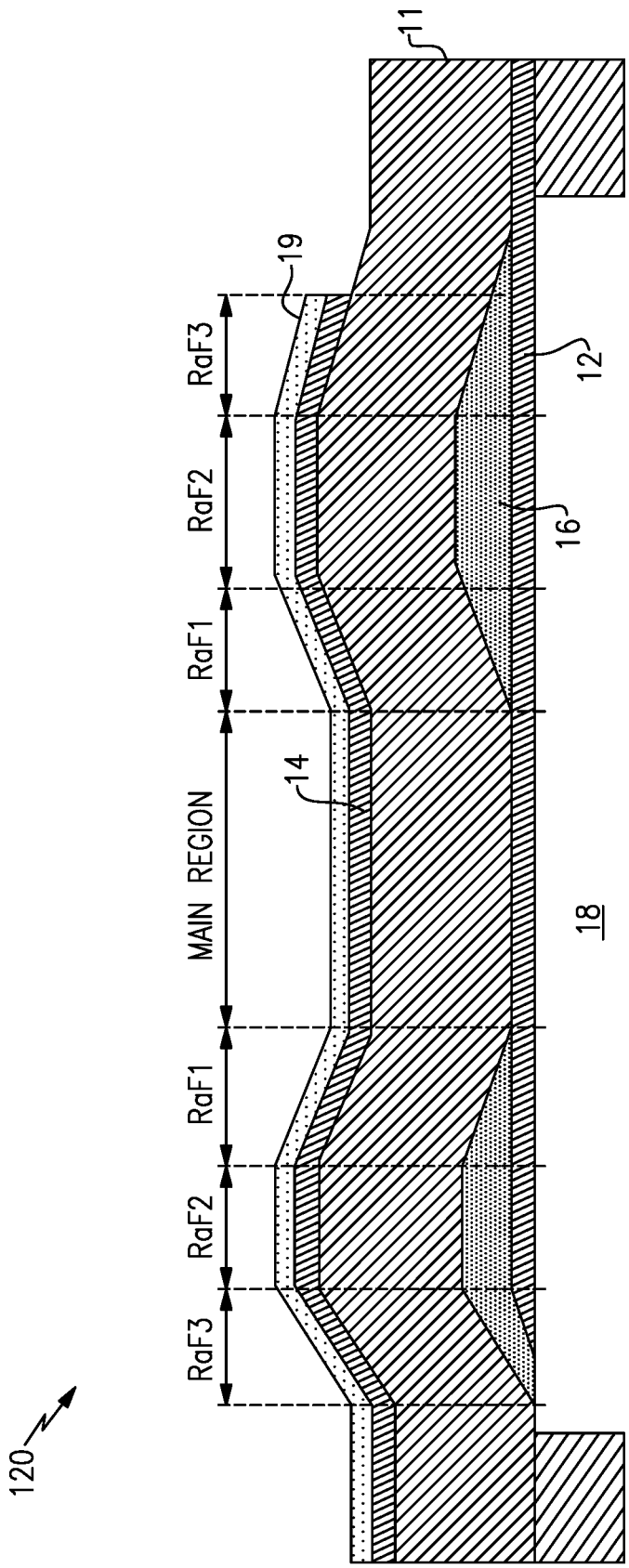
FIG. 12 is a cross-sectional view of a BAW device according to another embodiment.

Although some multi-gradient raised frame BAW devices disclosed herein include a plurality of raised frame layers, multi-gradient raised frame BAW devices can include a single raised frame layer. FIGS. 10, 11, and 12 illustrate examples of such BAW devices.

FIG. 10 illustrates a schematic cross-sectional view of a BAW device 100 with a single layer raised frame structure according to an embodiment. The raised frame layer 16 is asymmetric about the center of the main acoustically active region of the BAW device 100 in the illustrated view. The BAW device 100 includes a multi-gradient raised frame structure with single raised frame layer. The single raised frame layer 16 corresponds to the second raised frame layer 16 of other BAW devices disclosed herein. The raised frame layer 16 can be considered a single layer even if it is formed of several layers of the same material. The raised frame layer 16 of the BAW device 100 can be of the same material as the electrode 14 in certain embodiments. The raised frame layer 16 of the BAW device 100 can have a relatively high acoustic impedance.

FIG. 11 illustrates a schematic cross-sectional view of a BAW device 110 with a single layer raised frame structure according to an embodiment. In the BAW device 110, the raised frame layer 15 corresponds to the first raised frame layer 15 of other embodiments. The single layer raised frame layer 15 of the BAW device 110 can be of the same material as the passivation layer 19 in certain embodiments. The raised frame layer 15 of the BAW device 110 can have a relatively low acoustic impedance that is lower than the acoustic impedance of the electrodes 12 and 14 and/or the piezoelectric layer 11. As illustrated, the raised frame layer 15 is positioned between the piezoelectric layer 11 and the electrode 14. In some other embodiments, the raised frame layer 15 can alternatively or additionally be positioned between the piezoelectric layer 11 and the electrode 12.

FIG. 12 illustrates a schematic cross-sectional view of a BAW device 120 according to an embodiment. The BAW device 120 includes a dual gradient raised frame structure where the raised frame structure is positioned between the piezoelectric layer 11 and the lower electrode 12. In the BAW device 120, the raised frame structure includes a single raised frame layer 16. The raised frame layer 16 of the BAW device 120 corresponds to the second raised frame layer 16 of BAW devices of other embodiments. As illustrated in FIG. 12, the raised frame layer is positioned between electrodes 12 and 14.

Figure 13:
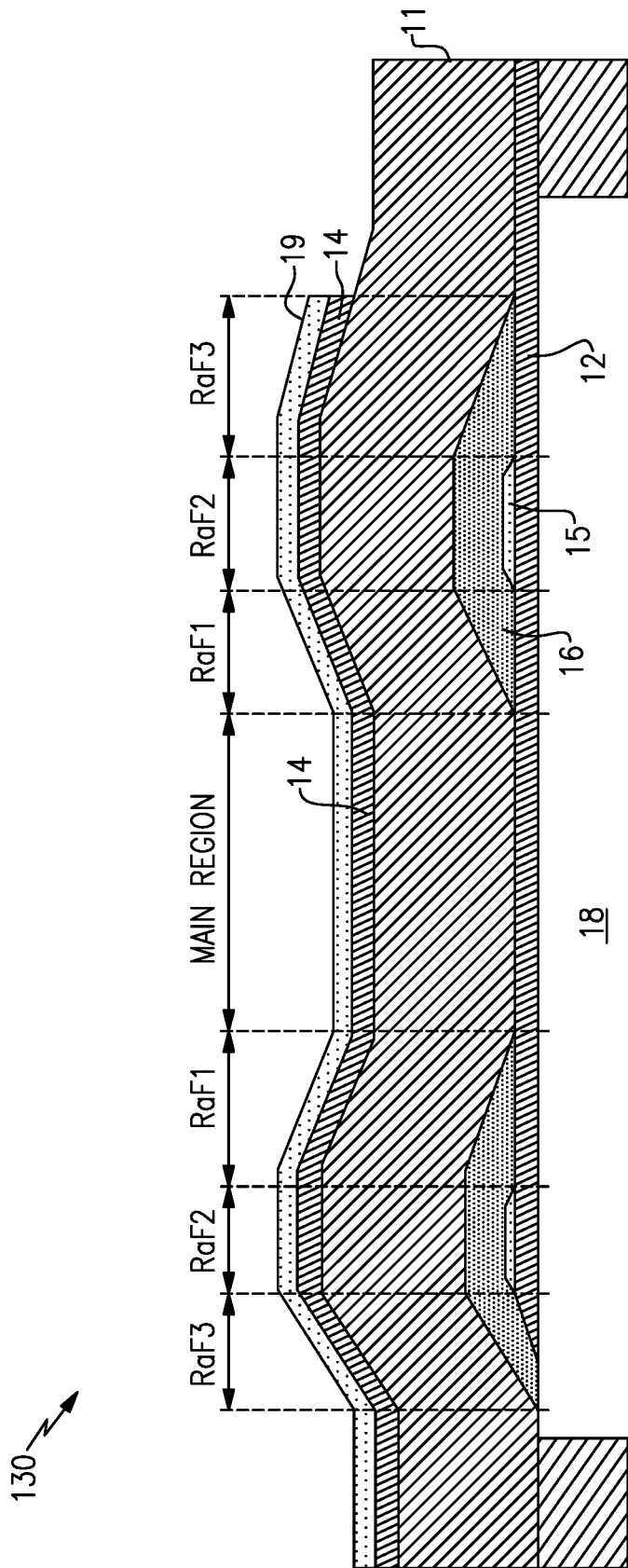
FIG. 13 is a cross-sectional view of a BAW device with a multi-gradient raised frame structure between a piezoelectric layer and a lower electrode according to an embodiment.

FIG. 13 illustrates a schematic cross-sectional view of a BAW device 130 according to an embodiment. The BAW device 130 includes a dual gradient raised frame structure where the raised frame structure includes two layers positioned between the piezoelectric layer 11 and the lower electrode 12. The dual gradient raised frame structure is positioned between the electrodes 12 and 14 in the BAW device 130. In the BAW device 130, the first raised frame layer 15 is positioned between the electrode 12 and the second raised frame layer 16. The second raised frame layer 16 includes a portion between the first raised frame layer 15 and the piezoelectric layer in the BAW device 130. The second raised frame layer 16 extends beyond the first raised frame layer 15 on opposing sides in FIG. 13.

Figure 14:
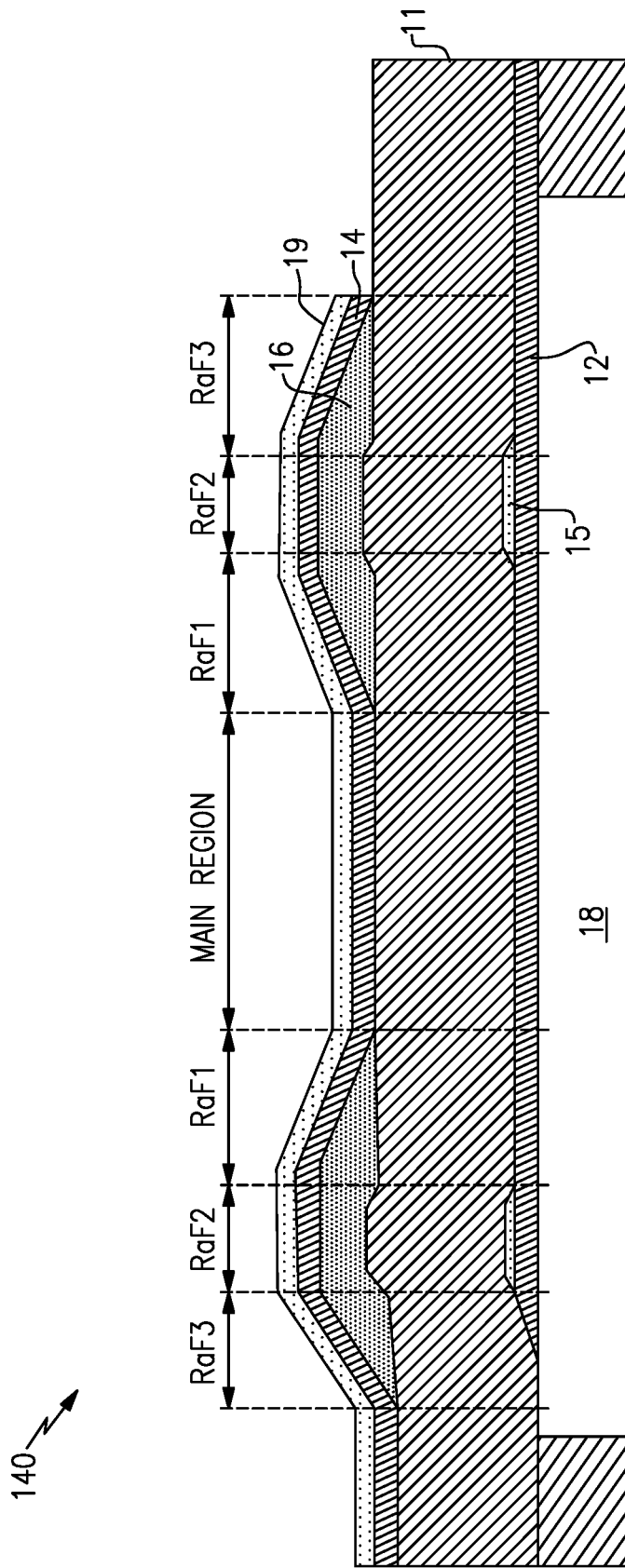
FIG. 14 is a cross-sectional view of a BAW device with a multi-gradient raised frame structure having raised frame layers on opposing sides of a piezoelectric layer according to an embodiment.

FIG. 14 illustrates a schematic cross-sectional view of a BAW device 140 according to an embodiment. The BAW device 140 includes a dual gradient raised frame structure where the raised frame structure includes two layers positioned between the electrodes 12 and 14 on opposing sides of the piezoelectric layer 11. In the BAW device 140, the piezoelectric layer 11 is positioned between the first raised frame layer 15 and the second raised frame layer 16, and the first raised frame layer 15 and the second raised frame layer 16 are both positioned between the electrodes 12 and 14. In the BAW device 140, the second raised frame layer 16 extends beyond the first raised frame layer 15 on opposing sides. The second raised frame layer 16 is positioned between the piezoelectric layer 11 and the second electrode 14 in the BAW device 140. The first raised frame layer 15 is positioned between the piezoelectric layer 11 and the first electrode 12 in the BAW device 140.

Figure 15:
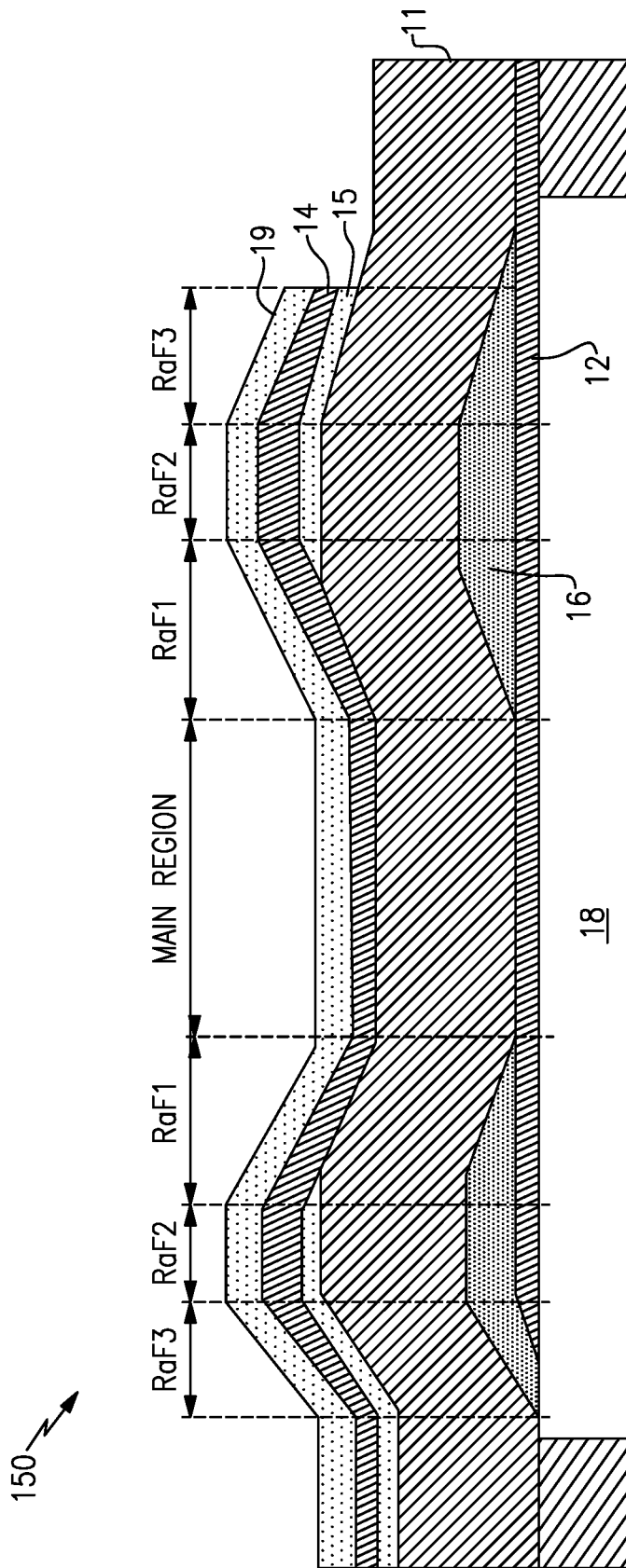
FIG. 15 is a cross-sectional view of a BAW device with a multi-layer raised frame structure having raised frame layers on opposing sides of a piezoelectric layer according to an embodiment.

FIG. 15 illustrates a schematic cross-sectional view of a BAW device 150 according to an embodiment. The BAW device 150 includes a dual gradient raised frame structure where the raised frame structure includes two layers positioned between the electrodes 12 and 14 on opposing sides of the piezoelectric layer 11. In the BAW device 150, the second raised frame layer 16 extends beyond the first raised frame layer 15 on an inner side of the raised frame structure toward the main acoustically active region. The second raised frame layer 16 does not extend beyond the first raised frame layer 15 on an outer side of the raised frame structure opposite the main acoustically active region in the BAW device 150. The second raised frame layer 16 is positioned between the piezoelectric layer 11 and the first electrode 12 over the acoustic reflector in the BAW device 150. The first raised frame layer 15 is positioned between the piezoelectric layer 11 and the second electrode 14 in the BAW device 150.

Embodiments disclosed herein relate to a multi-layer raised frame structure configured to reduce lateral energy leakage from a main acoustically active region of the bulk acoustic wave device, where a layer of the multi-layer raised frame structure is embedded in the piezoelectric layer. Example embodiments with a raised frame layer embedded in a piezoelectric layer will be discussed with reference to FIGS. 16, 18, and 20.

Figure 16:
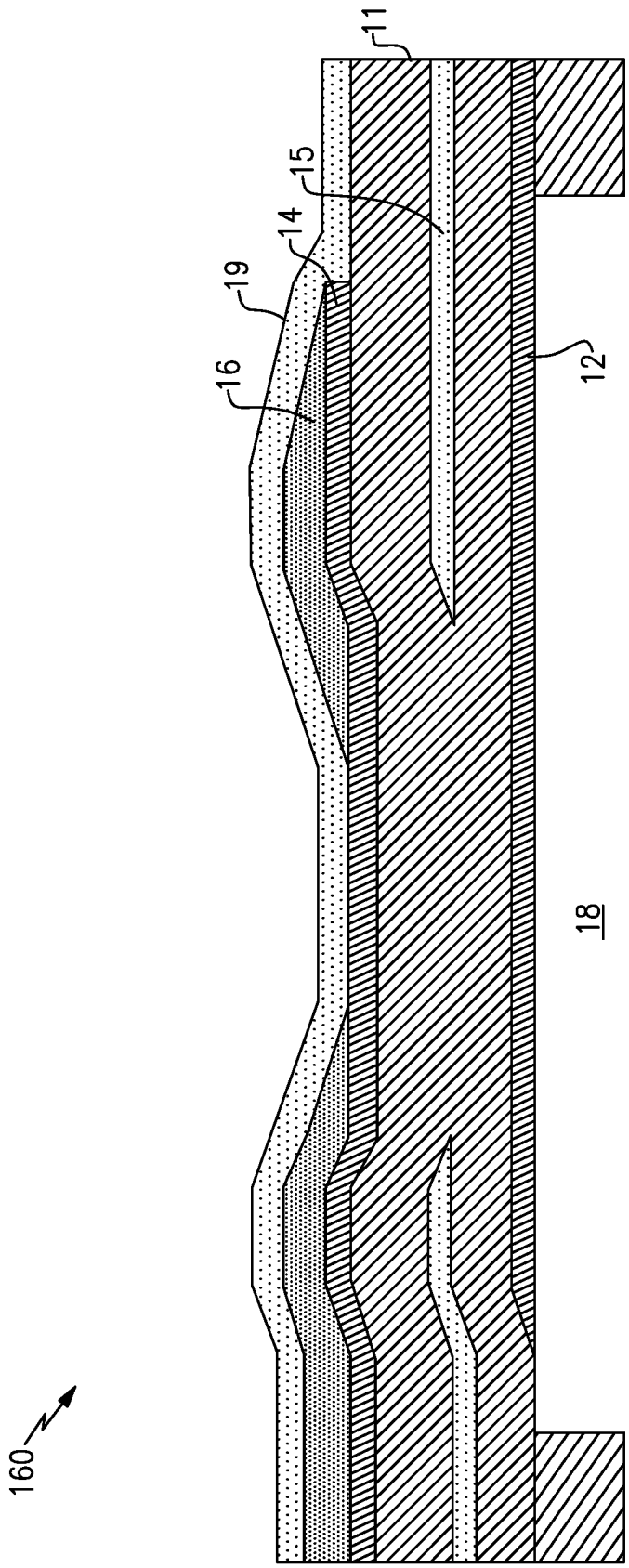
FIG. 16 is a cross-sectional view of a BAW device with a multi-layer raised frame structure having a raised frame layer embedded in a piezoelectric layer according to an embodiment.

FIG. 16 illustrates a schematic cross-sectional view of a BAW device 160 according to an embodiment. The BAW device 160 includes a dual layer raised frame structure with a raised frame layer 15 embedded in the piezoelectric layer 11. The piezoelectric layer 11 can include different material on opposing sides of the embedded raised frame layer 15 in certain applications. For instance, on one side of the embedded raised frame layer 15 the piezoelectric layer 11 can include AlN, and the piezoelectric layer 11 can include AlN doped with scandium on an opposite side of the embedded raised frame layer 15. In certain instances, the piezoelectric layer 11 includes the same material on opposing sides of the embedded raised frame structure. In the BAW device 160, the second raised frame layer 16 extends beyond the first raised frame layer 15 on inner side of raised frame structure toward main acoustically active region of the BAW device 160. The second raised frame layer 16 does not extend beyond the first raised frame layer 15 on an outer side of the raised frame structure opposite the main acoustically active region in the BAW device 160.

Figure 17:
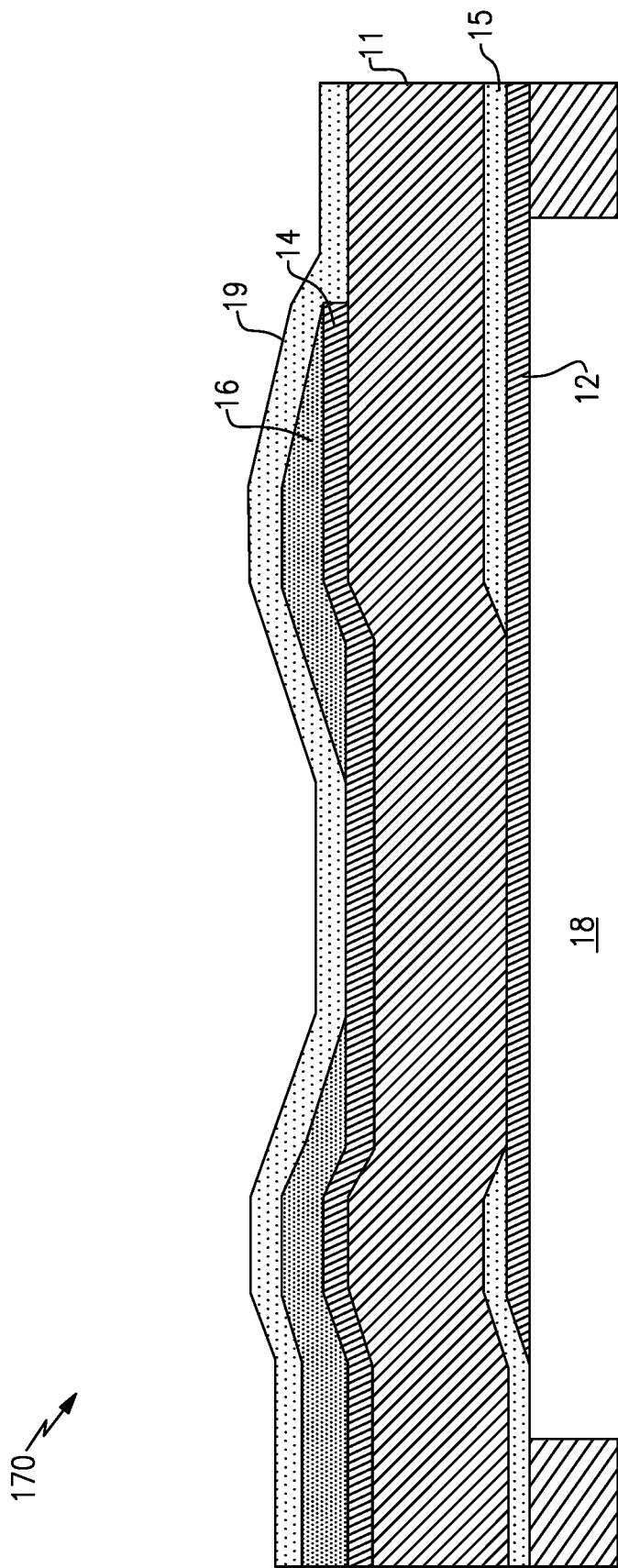
FIG. 17 is a schematic cross-sectional view of a BAW device with a multi-layer raised frame structure with gradients according to an embodiment.

FIG. 17 illustrates a schematic cross-sectional view of a BAW device 170 with a multi-layer raised frame structure with gradients according to an embodiment. In the BAW device 170, the first raised frame layer 16 is embedded in the piezoelectric layer 11. The BAW device 170 is similar to the BAW device 160 of FIG. 16, except that the first raised frame layer 15 is positioned between the piezoelectric layer 11 and the first electrode 12 over the acoustic reflector in the BAW device 160.

Figure 18:
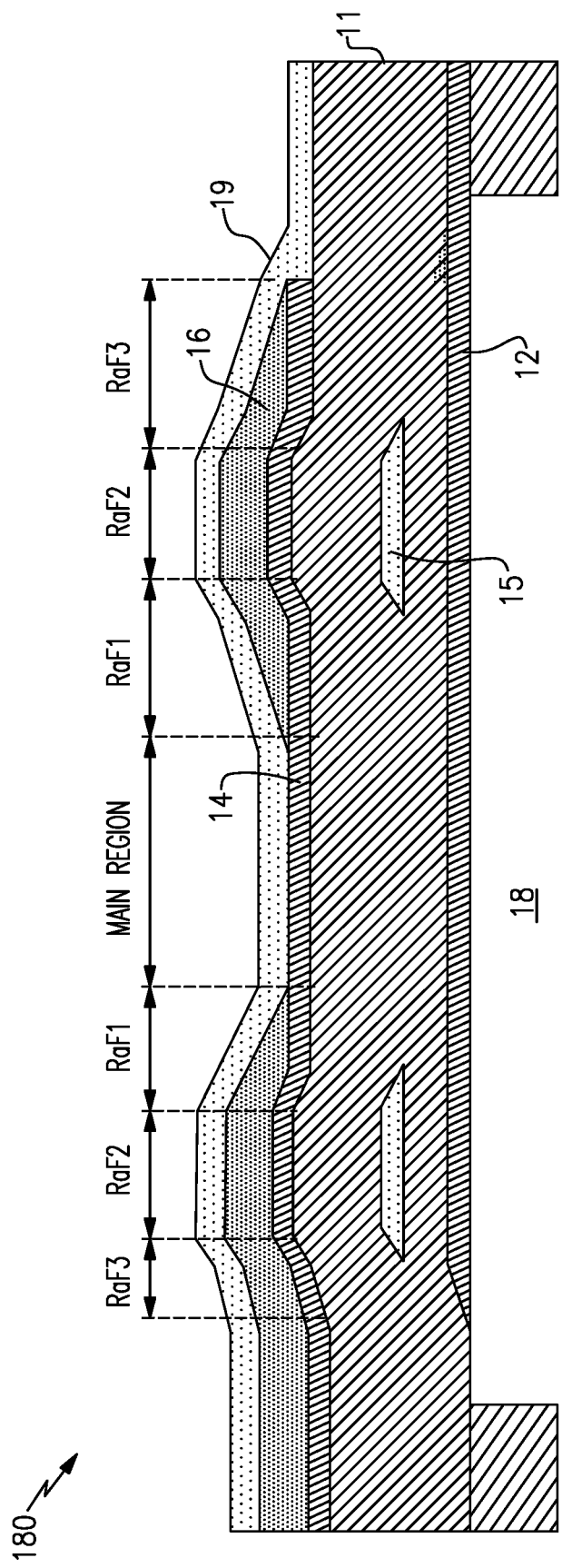
FIG. 18 is a schematic cross-sectional view of a BAW device with a dual gradient raised frame structure with a raised frame layer embedded in the piezoelectric layer according to an embodiment.

FIG. 18 illustrates a schematic cross-sectional view of a BAW device 180 with a dual gradient raised frame structure with a raised frame layer 15 embedded in the piezoelectric layer 11 according to an embodiment. The BAW device 180 is similar to the BAW device 10 of FIG. 1, except that the first raised frame layer 15 is embedded in the piezoelectric layer 11 in the BAW device 180.

Figure 19:
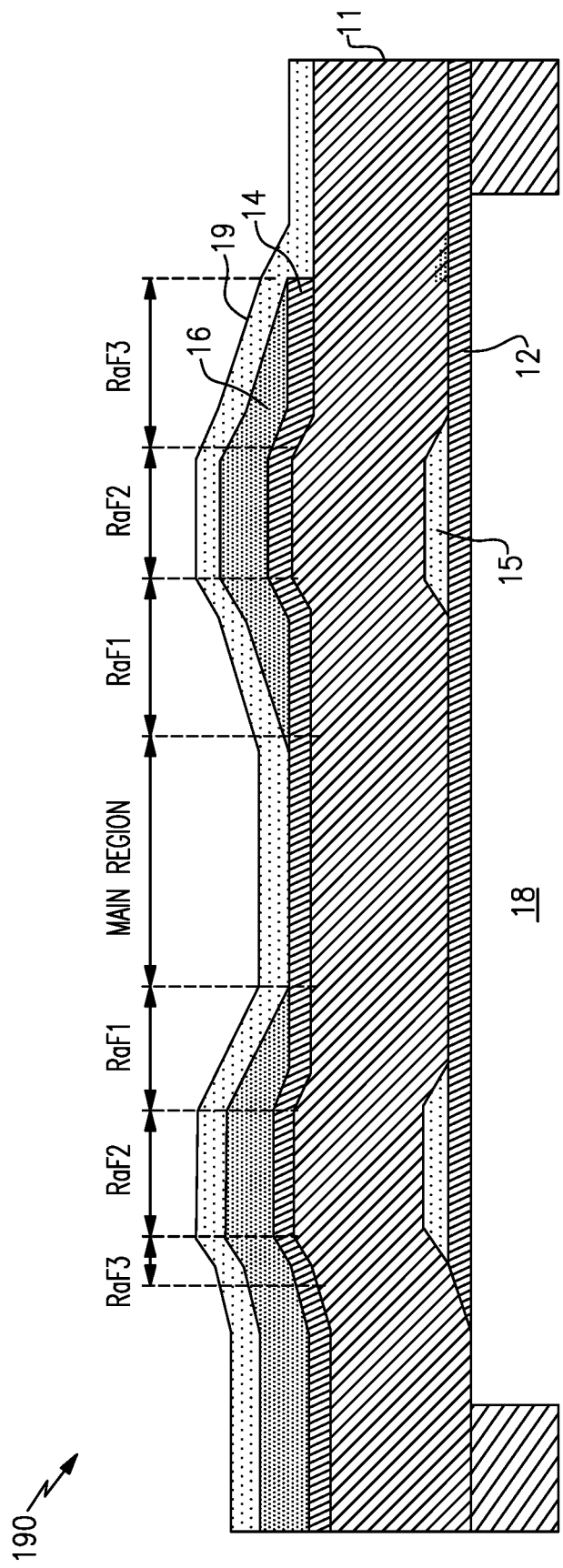
FIG. 19 is a schematic cross-sectional view of a BAW device with a dual gradient raised frame structure according to an embodiment.

FIG. 19 illustrates a schematic cross-sectional view of a BAW device 190 with a dual gradient raised frame structure according to an embodiment. The BAW device 190 is similar to the BAW device 10 of FIG. 1, except that the first raised frame layer 15 is positioned between the piezoelectric layer 11 and the first electrode 12 in the BAW device 190. The BAW device 190 is similar to the BAW device 170 of FIG. 17, except that the second raised frame layer 16 extends beyond the first raised frame layer 15 on both an inner side and an outer side of the raised frame structure in the BAW device 190.

Figure 20:
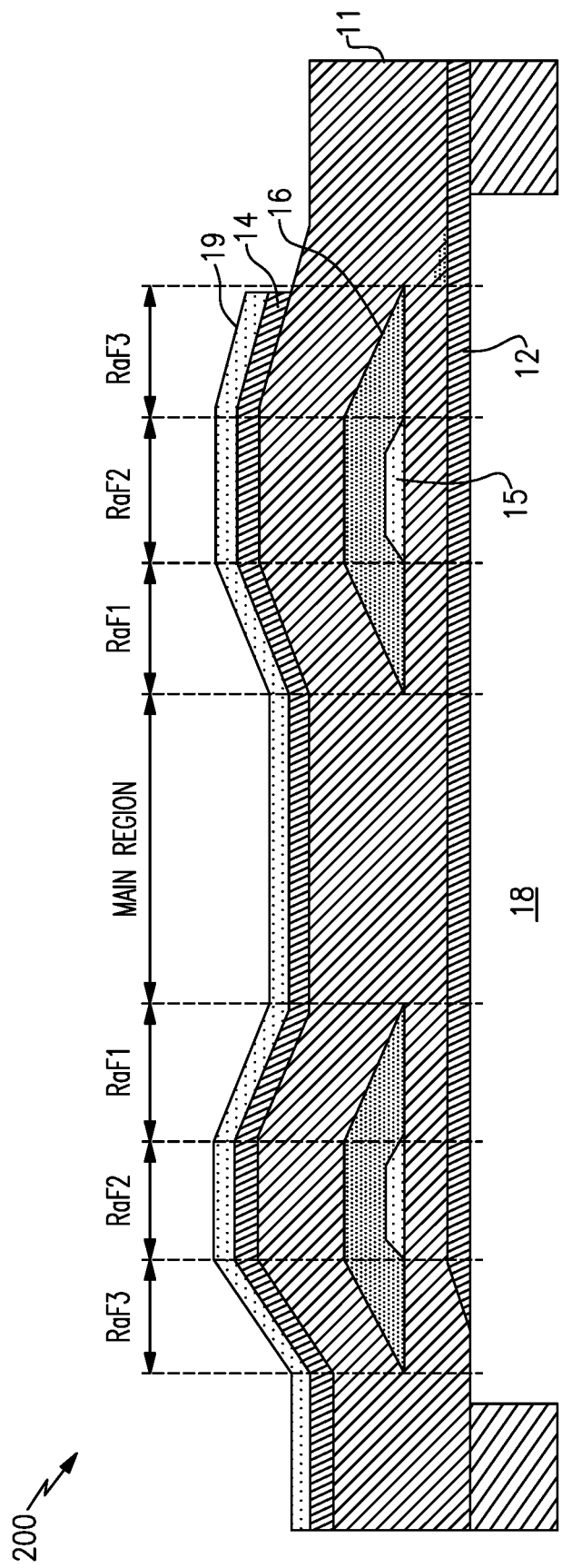
FIG. 20 illustrates a schematic cross-sectional view of a BAW device according to an embodiment.

FIG. 20 illustrates a schematic cross-sectional view of a BAW device 200 according to an embodiment. In certain applications, a multi-gradient raised frame structure can be embedded in a piezoelectric layer 11. The BAW device 200 includes a dual gradient raised frame structure where two layers 15 and 16 of the raised frame structure are embedded in the piezoelectric layer 11.

FIG. 21 illustrates a schematic cross-sectional view of a BAW device 210 according to an embodiment. The BAW device 210 is an example of a BAW device with a multi-gradient raised frame structure that consists or consists essentially of gradient regions RaF1 and RaF3. In such a BAW device, the raised frame structure can have a relatively narrow width over the acoustic reflector.

Figure 22:
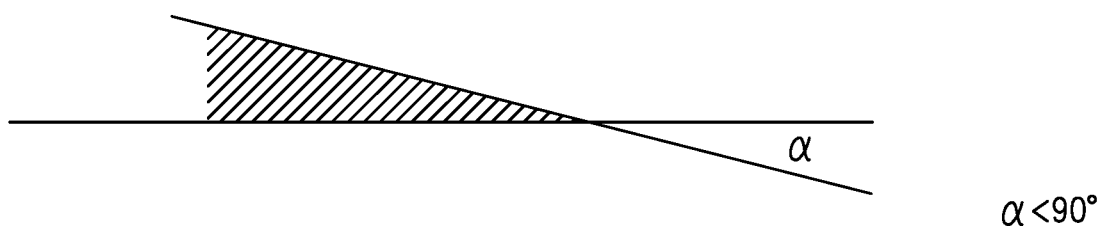
FIG. 22 illustrates a taper angle for a gradient portion of a raised frame layer.

A gradient portion of a raised frame layer can have a taper angle α with respect to a horizontal direction in the illustrated schematic cross-sectional views. The taper angle α can be with respect to an underlying layer (e.g., a piezoelectric layer and/or an electrode layer). FIG. 22 illustrates a taper angle α. The taper angle α can be less than 45°. In some applications, the taper angle can be less than 45° for a gradient portion of a raised frame layer in a first gradient region RaF1. The taper angle can also be greater than 5° in a first gradient region RaF1 in such applications. In some instances, the taper angle can be in a range from about 5° to 45° for a gradient portion of a raised frame layer in a first gradient region RaF1. In some applications, the taper angle can be less than 45° for a gradient portion of a raised frame layer in a second gradient region RaF3 of any of the embodiments disclosed herein. The taper angle can also be greater than 5° in a second gradient region RaF3 in such applications. In some instances, the taper angle can be in a range from about 5° to 45° for a gradient portion of a raised frame layer in a second gradient region RaF3 of any of the embodiments disclosed herein.

In certain applications, the taper angle can be in a range from about 10° to 40° for a gradient portion of a raised frame layer in a first gradient region RaF1 and/or a second gradient region RaF3 of any of the embodiments disclosed herein. In some applications, the taper angle can be in a range from about 10° to 30° for a gradient portion of a raised frame layer in a first gradient region RaF1 and/or a second gradient region RaF3 of any of the embodiments disclosed herein.

The taper angles can be approximately the same for the first and second gradient regions RaF1 and RaF3 in certain applications. The taper angles can be different for the first and second gradient regions RaF1 and RaF3 in some other applications. The taper angles discussed in this paragraph can be applied to any suitable BAW devices disclosed herein.

Figure 23:
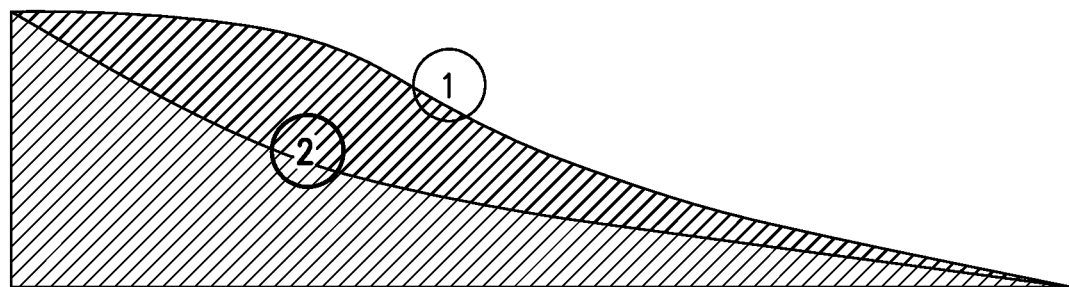
FIG. 23 illustrates examples gradient portions of a raised frame layer where the gradient portion are non-linear.

FIG. 23 illustrates examples gradient portions of a raised frame layer where the gradient portion can be non-linear. A non-linear gradient portion can include a convex portion, a concave portion, or any combination thereof. Other variations of gradient raised frame layer portions are possible.

BAW devices disclosed herein can be implemented as BAW resonators in in acoustic wave filters. Such filters can be arranged to filter a radio frequency signal. In certain applications, the acoustic wave filters can be band pass filters arranged to pass a radio frequency band and attenuate frequencies outside of the radio frequency band. Acoustic wave filters can implement band rejection filters. Bulk acoustic wave devices disclosed herein can be implemented in a variety of different filter topologies. Example filter topologies include a ladder filter, a lattice filter, and a hybrid ladder lattice filter, and the like. An acoustic wave filter can include all BAW resonators or one or more BAW resonators and one or more other types of acoustic wave resonators such as a SAW resonator. BAW resonators disclosed herein can be implemented in a filter that includes at least one BAW resonator and a non-acoustic inductor-capacitor component. Some example filter topologies will now be discussed with reference to FIGS. 24 to 26. Any suitable combination of features of the filter topologies of FIGS. 24 to 26 can be implemented together with each other and/or with other filter topologies.

Figure 24:
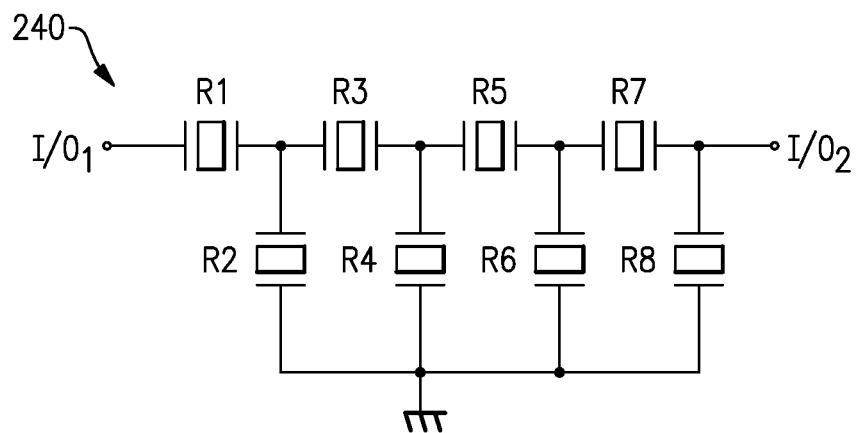
FIG. 24 is a schematic diagram of a ladder filter that includes a bulk acoustic wave resonator according to an embodiment.

FIG. 24 is a schematic diagram of a ladder filter 240 that includes a bulk acoustic wave resonator according to an embodiment. The ladder filter 240 is an example topology that can implement a band pass filter formed from acoustic wave resonators. In a band pass filter with a ladder filter topology, the shunt resonators can have lower resonant frequencies than the series resonators. The ladder filter 240 can be arranged to filter a radio frequency signal. As illustrated, the ladder filter 240 includes series acoustic wave resonators R1, R3, R5, and R7 and shunt acoustic wave resonators R2, R4, R6, and R8 coupled between a first input/output port $I/O_1$ and a second input/output port $I/O_2$. Any suitable number of series acoustic wave resonators can be in included in a ladder filter. Any suitable number of shunt acoustic wave resonators can be included in a ladder filter. The first input/output port $I/O_1$ can be a transmit port and the second input/output port $I/O_2$ can be an antenna port. Alternatively, first input/output port $I/O_1$ can be a receive port and the second input/output port $I/O_2$ can be an antenna port.

One or more of the acoustic wave resonators of the ladder filter 240 can include a bulk acoustic wave filter according to an embodiment. For example, some or all of the shunt resonators R2, R4, R6, and R8 can be a multi-gradient raised frame BAW resonator in accordance with any suitable principles and advantages disclosed herein. The anti-resonant frequency of the shunt resonators of the ladder filter 240 can set a lower edge of the pass band when the ladder filter 240 is a band pass filter. With multi-gradient raised frame BAW shunt resonators, high quality factor stability for a quality factor at anti-resonance Qp can advantageously be achieved, for example, as indicated by the graph of FIG. 3B. Alternatively or additionally, one or more of the series resonators of the ladder filter 240 can be implemented in accordance with any suitable principles and advantages disclosed herein.

Figure 25:
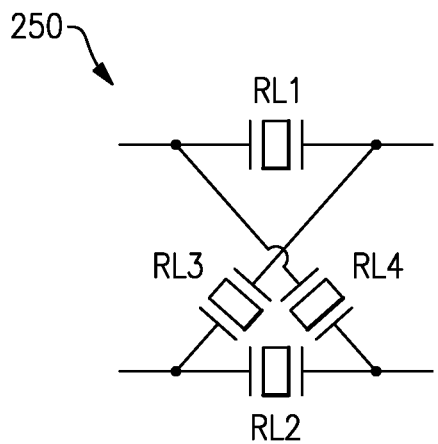
FIG. 25 is a schematic diagram of a lattice filter that includes a bulk acoustic wave resonator according to an embodiment.

FIG. 25 is a schematic diagram of a lattice filter 250 that includes a bulk acoustic wave resonator according to an embodiment. The lattice filter 250 is an example topology that can form a band pass filter from acoustic wave resonators. The lattice filter 250 can be arranged to filter an RF signal. As illustrated, the lattice filter 250 includes acoustic wave resonators RL1, RL2, RL3, and RL4. The acoustic wave resonators RL1 and RL2 are series resonators. The acoustic wave resonators RL3 and RL4 are shunt resonators. The illustrated lattice filter 250 has a balanced input and a balanced output. One or more of the illustrated acoustic wave resonators RL1 to RL4 can be a bulk acoustic wave resonator in accordance with any suitable principles and advantages disclosed herein.

Figure 26:
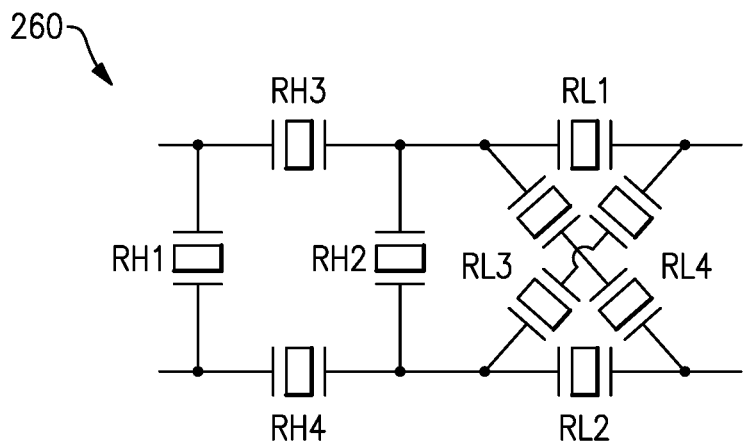
FIG. 26 is a schematic diagram of a hybrid ladder lattice filter that includes a bulk acoustic wave resonator according to an embodiment.

FIG. 26 is a schematic diagram of a hybrid ladder and lattice filter 260 that includes a bulk acoustic wave resonator according to an embodiment. The illustrated hybrid ladder and lattice filter 260 includes series acoustic resonators RL1, RL2, RH3, and RH4 and shunt acoustic resonators RL3, RL4, RH1, and RH2. The hybrid ladder and lattice filter 260 includes one or more bulk acoustic wave resonators in accordance with any suitable principles and advantages disclosed herein.

In some applications, a bulk acoustic wave resonator can be included in filter that also includes one or more inductors and one or more capacitors.

The principles and advantages disclosed herein can be implemented in a standalone filter and/or in one or more filters in any suitable multiplexer. Such filters can be any suitable topology discussed herein, such as any filter topology in accordance with any suitable principles and advantages disclosed with reference to any of FIG. 21. The filter can be a band pass filter arranged to filter a fourth generation (4G) Long Term Evolution (LTE) band and/or a fifth generation (5G) New Radio (NR) band. Examples of a standalone filter and multiplexers will be discussed with reference to FIGS. 27A to 27E. Any suitable principles and advantages of these filters and/or multiplexers can be implemented together with each other. Moreover, the multi-gradient raised frame bulk acoustic bulk acoustic wave resonators disclosed herein can be included in filter that also includes one or more inductors and one or more capacitors.

Figure 27A:
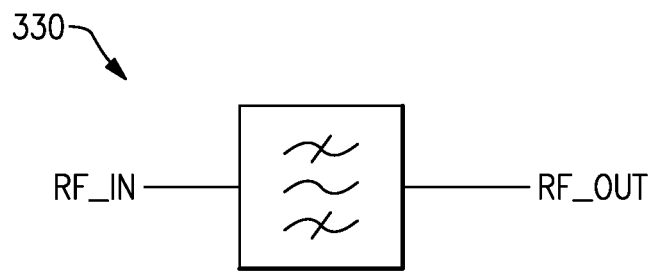
FIG. 27A is schematic diagram of an acoustic wave filter.

FIG. 27A is schematic diagram of an acoustic wave filter 330. The acoustic wave filter 330 is a band pass filter. The acoustic wave filter 330 is arranged to filter a radio frequency signal. The acoustic wave filter 330 includes a plurality of acoustic wave resonators coupled between a first input/output port RF_IN and a second input/output port RF_OUT. The acoustic wave filter 330 includes one or more BAW resonators with a multi-gradient raised frame structure implemented in accordance with any suitable principles and advantages disclosed herein.

Figure 27B:
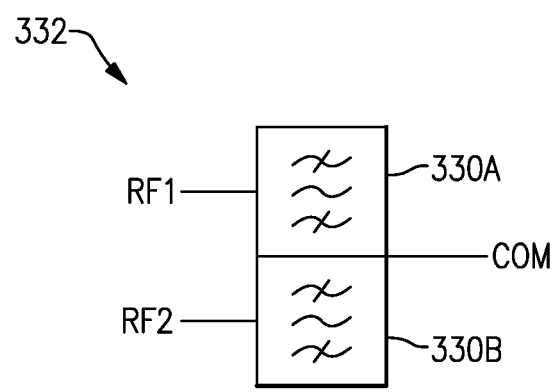
FIG. 27B is a schematic diagram of a duplexer that includes an acoustic wave filter according to an embodiment.

FIG. 27B is a schematic diagram of a duplexer 332 that includes an acoustic wave filter according to an embodiment. The duplexer 332 includes a first filter 330A and a second filter 330B coupled to together at a common node COM. One of the filters of the duplexer 332 can be a transmit filter and the other of the filters of the duplexer 332 can be a receive filter. In some other instances, such as in a diversity receive application, the duplexer 332 can include two receive filters. Alternatively, the duplexer 332 can include two transmit filters. The common node COM can be an antenna node.

The first filter 330A is an acoustic wave filter arranged to filter a radio frequency signal. The first filter 330A includes acoustic wave resonators coupled between a first radio frequency node RF1 and the common node COM. The first radio frequency node RF1 can be a transmit node or a receive node. The first filter 330A includes one or more BAW resonators with a multi-gradient raised frame structure implemented in accordance with any suitable principles and advantages disclosed herein.

The second filter 330B can be any suitable filter arranged to filter a second radio frequency signal. The second filter 330B can be, for example, an acoustic wave filter, an acoustic wave filter that includes one or more BAW resonators with a multi-gradient raised frame structure implemented in accordance with any suitable principles and advantages disclosed herein, an LC filter, a hybrid acoustic wave LC filter, or the like. The second filter 330B is coupled between a second radio frequency node RF2 and the common node. The second radio frequency node RF2 can be a transmit node or a receive node.

Although example embodiments may be discussed with filters or duplexers for illustrative purposes, any suitable principles and advantages disclosed herein can be implemented in a multiplexer that includes a plurality of filters coupled together at a common node. Examples of multiplexers include but are not limited to a duplexer with two filters coupled together at a common node, a triplexer with three filters coupled together at a common node, a quadplexer with four filters coupled together at a common node, a hexaplexer with six filters coupled together at a common node, an octoplexer with eight filters coupled together at a common node, or the like. Multiplexers can include filters having different passbands. Multiplexers can include any suitable number of transmit filters and any suitable number of receive filters. For example, a multiplexer can include all receive filters, all transmit filters, or one or more transmit filters and one or more receive filters. One or more filters of a multiplexer can include any suitable number of BAW resonators with a multi-gradient raised frame structure.

Figure 27C:
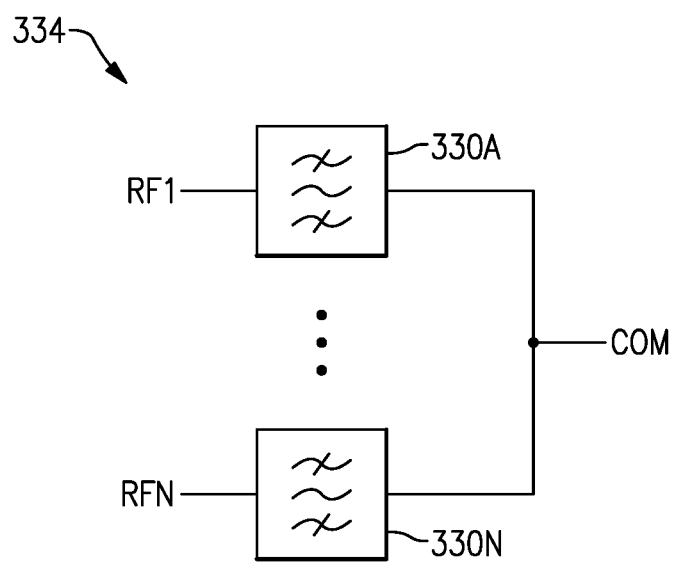
FIG. 27C is a schematic diagram of a multiplexer that includes an acoustic wave filter according to an embodiment.

FIG. 27C is a schematic diagram of a multiplexer 334 that includes an acoustic wave filter according to an embodiment. The multiplexer 334 includes a plurality of filters 330A to 330N coupled together at a common node COM. The plurality of filters can include any suitable number of filters including, for example, 3 filters, 4 filters, 5 filters, 6 filters, 7 filters, 8 filters, or more filters. Some or all of the plurality of acoustic wave filters can be acoustic wave filters. As illustrated, the filters 330A to 330N each have a fixed electrical connection to the common node COM. This can be referred to as hard multiplexing or fixed multiplexing. Filters have fixed electrical connections to the common node in hard multiplexing applications. Each of the filters 330A to 330N has a respective input/output node RF1 to RFN.

The first filter 330A is an acoustic wave filter arranged to filter a radio frequency signal. The first filter 330A can include one or more acoustic wave devices coupled between a first radio frequency node RF1 and the common node COM. The first radio frequency node RF1 can be a transmit node or a receive node. The first filter 330A includes one or more BAW resonators with a multi-gradient raised frame structure in accordance with any suitable principles and advantages disclosed herein. The other filter(s) of the multiplexer 334 can include one or more acoustic wave filters, one or more acoustic wave filters that include one or more BAW resonators with a multi-gradient raised frame structure, one or more LC filters, one or more hybrid acoustic wave LC filters, or any suitable combination thereof.

Figure 27D:
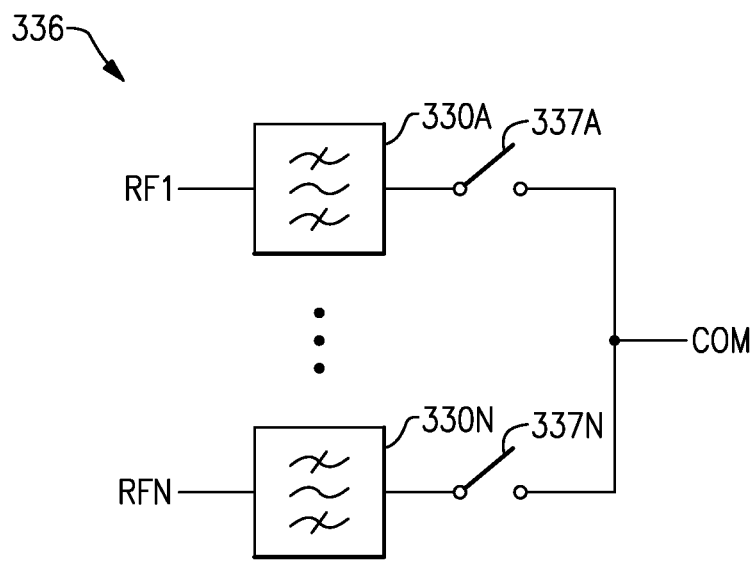
FIG. 27D is a schematic diagram of a multiplexer that includes an acoustic wave filter according to an embodiment.

FIG. 27D is a schematic diagram of a multiplexer 336 that includes an acoustic wave filter according to an embodiment. The multiplexer 336 is like the multiplexer 334 of FIG. 27C, except that the multiplexer 336 implements switched multiplexing. In switched multiplexing, a filter is coupled to a common node via a switch. In the multiplexer 336, the switches 337A to 337N can selectively electrically connect respective filters 330A to 330N to the common node COM. For example, the switch 337A can selectively electrically connect the first filter 330A to the common node COM via the switch 337A. Any suitable number of the switches 337A to 337N can electrically a respective filters 330A to 330N to the common node COM in a given state. Similarly, any suitable number of the switches 337A to 337N can electrically isolate a respective filter 330A to 330N to the common node COM in a given state. The functionality of the switches 337A to 337N can support various carrier aggregations.

Figure 27E:
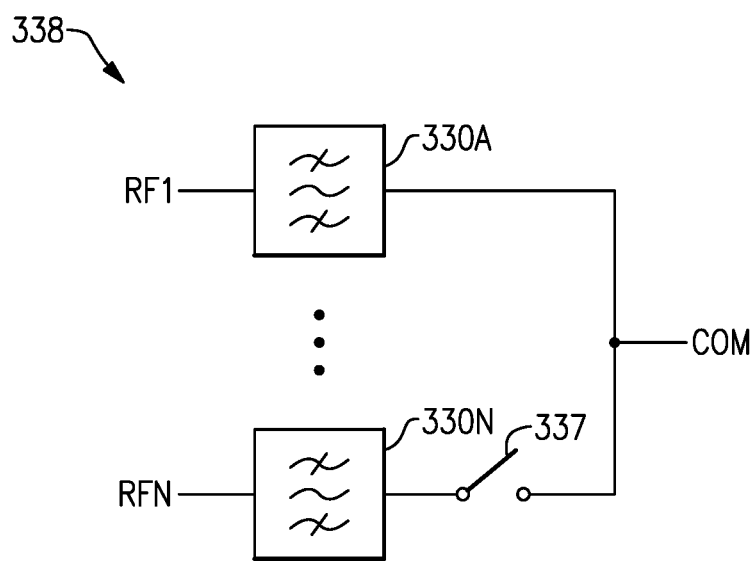
FIG. 27E is a schematic diagram of a multiplexer that includes an acoustic wave filter according to an embodiment.

FIG. 27E is a schematic diagram of a multiplexer 338 that includes an acoustic wave filter according to an embodiment. The multiplexer 338 illustrates that a multiplexer can include any suitable combination of hard multiplexed and switched multiplexed filters. One or more BAW resonators with a multi-gradient raised frame structure can be included in a filter that is hard multiplexed to the common node of a multiplexer. Alternatively or additionally, one or more BAW resonators with a multi-gradient raised frame structure can be included in a filter that is switch multiplexed to the common node of a multiplexer.

BAW resonators disclosed herein can be implemented in a variety of packaged modules. Some example packaged modules will now be discussed in which any suitable principles and advantages of the BAW devices disclosed herein can be implemented. Example packaged modules include one or more acoustic wave filters and one or more radio frequency amplifiers (e.g., one or more power amplifiers and/or one or more low noise amplifiers) and/or one or more radio frequency switches. The example packaged modules can include a package that encloses the illustrated circuit elements. The illustrated circuit elements can be disposed on a common packaging substrate. The packaging substrate can be a laminate substrate, for example. FIGS. 28 to 32 are schematic block diagrams of illustrative packaged modules according to certain embodiments. Any suitable combination of features of these packaged modules can be implemented with each other. While duplexers are illustrated in the example packaged modules of FIGS. 29 to 32, any other suitable multiplexer that includes a plurality of filters coupled to a common node can be implemented instead of one or more duplexers. For example, a quadplexer can be implemented in certain applications. Alternatively or additionally, one or more filters of a packaged module can be arranged as a transmit filter or a receive filter that is not included in a multiplexer.

Figure 28:
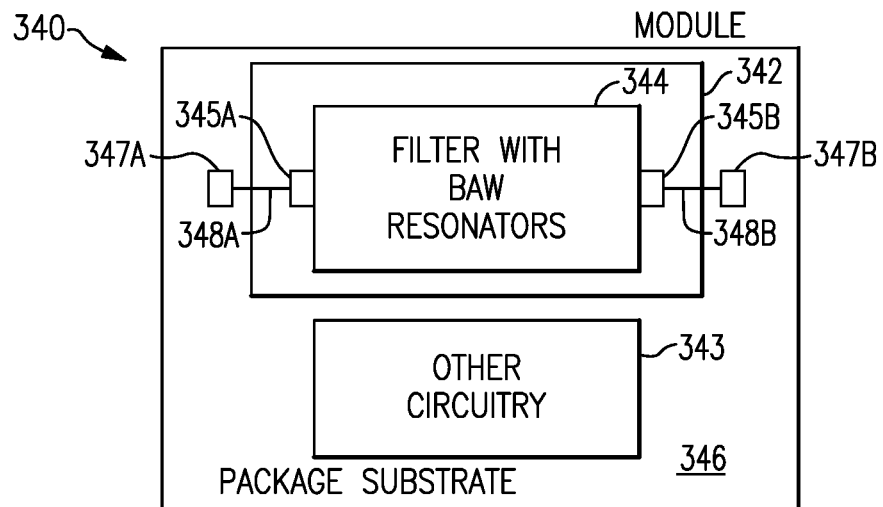
FIGS. 28, 29, 30, 31, and 32 are schematic block diagrams of illustrative packaged modules according to certain embodiments.

FIG. 28 is a schematic diagram of a radio frequency module 340 that includes an acoustic wave component 342 according to an embodiment. The illustrated radio frequency module 340 includes the acoustic wave component 342 and other circuitry 343. The acoustic wave component 342 can include one or more BAW resonators with a multi-gradient raised frame structure in accordance with any suitable combination of features disclosed herein. The acoustic wave component 342 can include a BAW die that includes BAW resonators.

The acoustic wave component 342 shown in FIG. 28 includes a filter 344 and terminals 345A and 345B. The filter 344 includes one or more BAW resonators implemented in accordance with any suitable principles and advantages disclosed herein. The terminals 345A and 344B can serve, for example, as an input contact and an output contact. The acoustic wave component 342 and the other circuitry 343 are on a common packaging substrate 346 in FIG. 28. The packaging substrate 346 can be a laminate substrate. The terminals 345A and 345B can be electrically connected to contacts 347A and 347B, respectively, on the packaging substrate 346 by way of electrical connectors 348A and 348B, respectively. The electrical connectors 348A and 348B can be bumps or wire bonds, for example.

The other circuitry 343 can include any suitable additional circuitry. For example, the other circuitry can include one or more one or more radio frequency amplifiers (e.g., one or more power amplifiers and/or one or more low noise amplifiers), one or more power amplifiers, one or more radio frequency switches, one or more additional filters, one or more low noise amplifiers, one or more RF couplers, one or more delay lines, one or more phase shifters, the like, or any suitable combination thereof. The other circuitry 343 can be electrically connected to the filter 344. The radio frequency module 340 can include one or more packaging structures to, for example, provide protection and/or facilitate easier handling of the radio frequency module 340. Such a packaging structure can include an overmold structure formed over the packaging substrate 340. The overmold structure can encapsulate some or all of the components of the radio frequency module 340.

Figure 29:
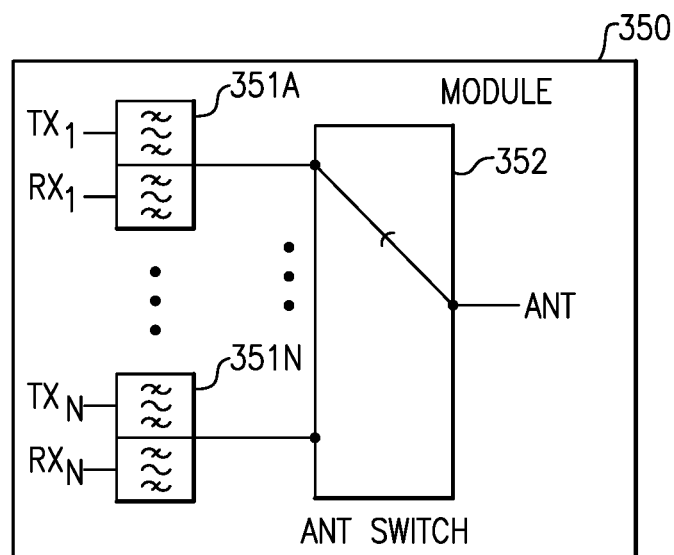

FIG. 29 is a schematic block diagram of a module 350 that includes duplexers 351A to 351N and an antenna switch 352. One or more filters of the duplexers 351A to 351N can include one or more BAW resonators with a multi-gradient raised frame structure in accordance with any suitable principles and advantages discussed herein. Any suitable number of duplexers 351A to 351N can be implemented. The antenna switch 352 can have a number of throws corresponding to the number of duplexers 351A to 351N. The antenna switch 352 can include one or more additional throws coupled to one or more filters external to the module 350 and/or coupled to other circuitry. The antenna switch 352 can electrically couple a selected duplexer to an antenna port of the module 350.

Figure 30:
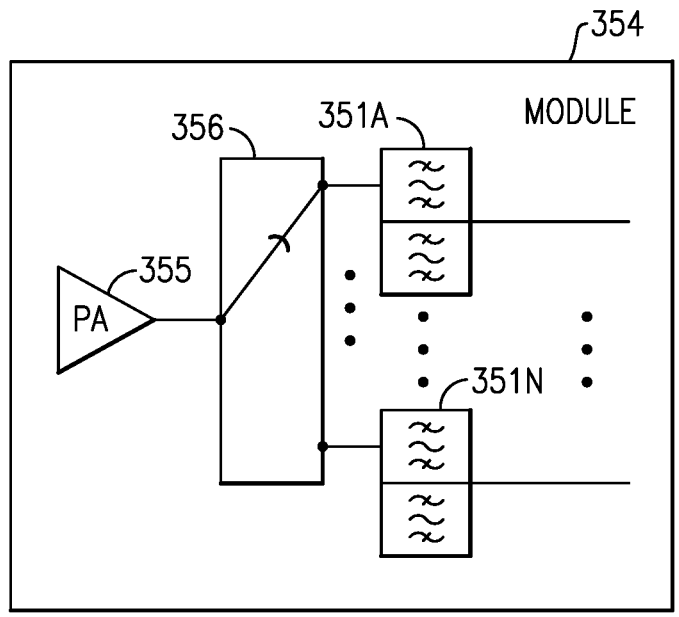

FIG. 30 is a schematic block diagram of a module 354 that includes a power amplifier 355, a radio frequency switch 356, and multiplexers 351A to 351N in accordance with one or more embodiments. The power amplifier 355 can amplify a radio frequency signal. The radio frequency switch 356 can be a multi-throw radio frequency switch. The radio frequency switch 356 can electrically couple an output of the power amplifier 355 to a selected transmit filter of the multiplexers 351A to 351N. One or more filters of the multiplexers 351A to 351N can include any suitable number of BAW resonators with a multi-gradient raised frame structure in accordance with any suitable principles and advantages discussed herein. Any suitable number of multiplexers 351A to 351N can be implemented.

Figure 31:
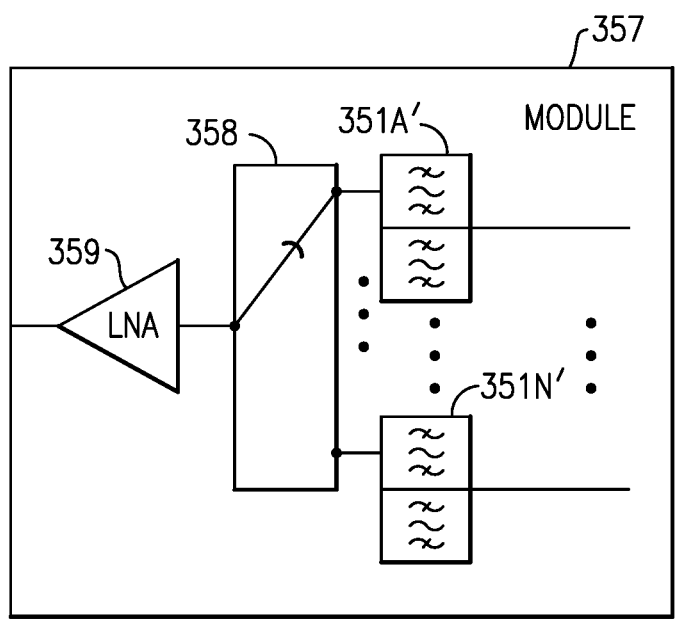

FIG. 31 is a schematic block diagram of a module 357 that includes multiplexers 351A' to 351N', a radio frequency switch 358, and a low noise amplifier 359 according to an embodiment. One or more filters of the multiplexers 351A' to 351N' can include any suitable number BAW resonators with a multi-gradient raised frame structure in accordance with any suitable principles and advantages disclosed herein. Any suitable number of multiplexers 351A' to 351N' can be implemented. The radio frequency switch 358 can be a multi-throw radio frequency switch. The radio frequency switch 358 can electrically couple an output of a selected filter of multiplexers 351A' to 351N' to the low noise amplifier 359. In some embodiments (not illustrated), a plurality of low noise amplifiers can be implemented. The module 357 can include diversity receive features in certain applications.

Figure 32:
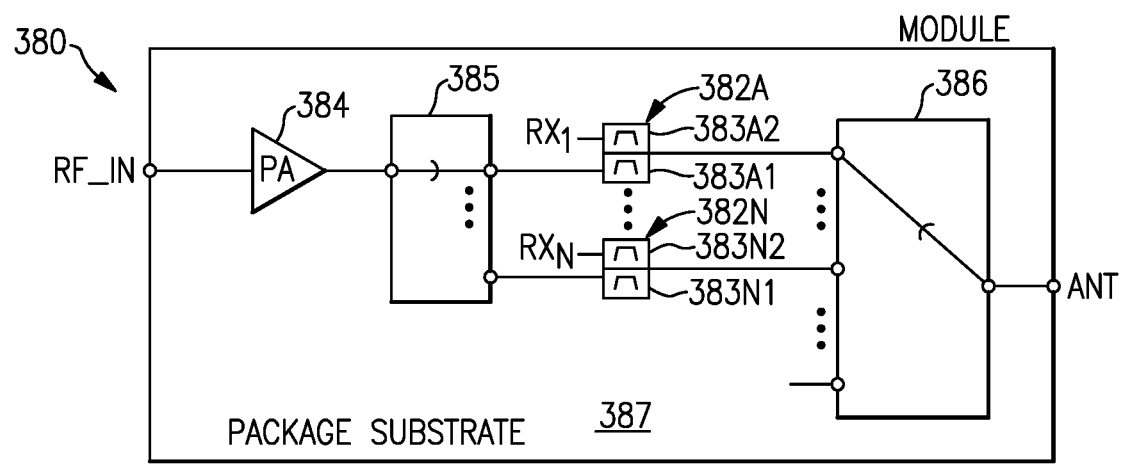

FIG. 32 is a schematic diagram of a radio frequency module 380 that includes an acoustic wave filter according to an embodiment. As illustrated, the radio frequency module 380 includes duplexers 382A to 382N that include respective transmit filters 383A1 to 383N1 and respective receive filters 383A2 to 383N2, a power amplifier 384, a select switch 385, and an antenna switch 386. The radio frequency module 380 can include a package that encloses the illustrated elements. The illustrated elements can be disposed on a common packaging substrate 387. The packaging substrate 387 can be a laminate substrate, for example. A radio frequency module that includes a power amplifier can be referred to as a power amplifier module. A radio frequency module can include a subset of the elements illustrated in FIG. 32 and/or additional elements. The radio frequency module 380 may include one or more BAW resonators with a multi-gradient raised frame structure in accordance with any suitable principles and advantages disclosed herein.

The duplexers 382A to 382N can each include two acoustic wave filters coupled to a common node. For example, the two acoustic wave filters can be a transmit filter and a receive filter. As illustrated, the transmit filter and the receive filter can each be a band pass filter arranged to filter a radio frequency signal. One or more of the transmit filters 383A1 to 383N1 can include one or more BAW resonators with a multi-gradient raised frame structure in accordance with any suitable principles and advantages disclosed herein. Similarly, one or more of the receive filters 383A2 to 383N2 can include one or more BAW resonators with a multi-gradient raised frame structure in accordance with any suitable principles and advantages disclosed herein. Although FIG. 32 illustrates duplexers, any suitable principles and advantages disclosed herein can be implemented in other multiplexers (e.g., quadplexers, hexaplexers, octoplexers, etc.) and/or in switched multiplexers.

The power amplifier 384 can amplify a radio frequency signal. The illustrated switch 385 is a multi-throw radio frequency switch. The switch 385 can electrically couple an output of the power amplifier 384 to a selected transmit filter of the transmit filters 383A1 to 383N1. In some instances, the switch 385 can electrically connect the output of the power amplifier 384 to more than one of the transmit filters 383A1 to 383N1. The antenna switch 386 can selectively couple a signal from one or more of the duplexers 382A to 382N to an antenna port ANT. The duplexers 382A to 382N can be associated with different frequency bands and/or different modes of operation (e.g., different power modes, different signaling modes, etc.).

Figure 33:
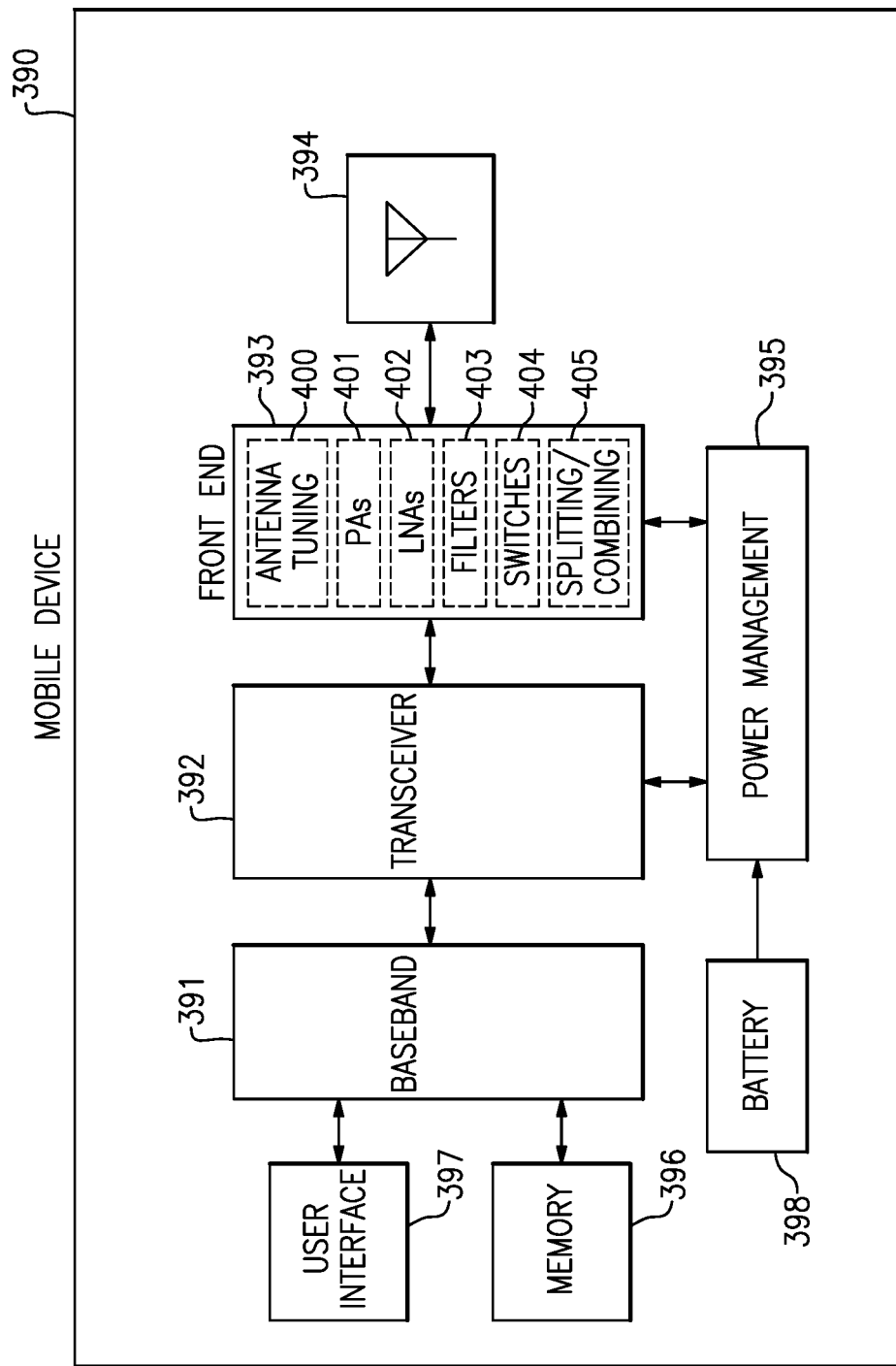
FIG. 33 is a schematic diagram of one embodiment of a mobile device.

BAW devices with a multi-gradient raised frame structure disclosed herein can be implemented in a variety of wireless communication devices, such as mobile devices. One or more filters with any suitable number of BAW devices implemented with any suitable principles and advantages disclosed herein can be included in a variety of wireless communication devices, such as mobile phones. The BAW devices can be included in a filter of a radio frequency front end. FIG. 33 is a schematic diagram of one embodiment of a mobile device 390. The mobile device 390 includes a baseband system 391, a transceiver 392, a front end system 393, antennas 394, a power management system 395, a memory 396, a user interface 397, and a battery 398.

The mobile device 390 can be used communicate using a wide variety of communications technologies, including, but not limited to, second generation (2G), third generation (3G), fourth generation (4G) (including LTE, LTE-Advanced, and LTE-Advanced Pro), fifth generation (5G) New Radio (NR), wireless local area network (WLAN) (for instance, WiFi), wireless personal area network (WPAN) (for instance, Bluetooth and ZigBee), WMAN (wireless metropolitan area network) (for instance, WiMax), Global Positioning System (GPS) technologies, or any suitable combination thereof.

The transceiver 392 generates RF signals for transmission and processes incoming RF signals received from the antennas 394. It will be understood that various functionalities associated with the transmission and receiving of RF signals can be achieved by one or more components that are collectively represented in FIG. 33 as the transceiver 392. In one example, separate components (for instance, separate circuits or dies) can be provided for handling certain types of RF signals.

The front end system 393 aids in conditioning signals transmitted to and/or received from the antennas 394. In the illustrated embodiment, the front end system 393 includes antenna tuning circuitry 400, power amplifiers (PAs) 401, low noise amplifiers (LNAs) 402, filters 403, switches 404, and signal splitting/combining circuitry 405. However, other implementations are possible. One or more of the filters 403 can be implemented in accordance with any suitable principles and advantages disclosed herein. For example, one or more of the filters 403 can include at least one BAW resonator with a multi-gradient raised frame structure in accordance with any suitable principles and advantages disclosed herein.

For example, the front end system 393 can provide a number of functionalities, including, but not limited to, amplifying signals for transmission, amplifying received signals, filtering signals, switching between different bands, switching between different power modes, switching between transmission and receiving modes, duplexing of signals, multiplexing of signals (for instance, diplexing or triplexing), or any suitable combination thereof.

In certain implementations, the mobile device 390 supports carrier aggregation, thereby providing flexibility to increase peak data rates. Carrier aggregation can be used for both Frequency Division Duplexing (FDD) and Time Division Duplexing (TDD), and may be used to aggregate a plurality of carriers or channels. Carrier aggregation includes contiguous aggregation, in which contiguous carriers within the same operating frequency band are aggregated. Carrier aggregation can also be non-contiguous, and can include carriers separated in frequency within a common band or in different bands.

The antennas 394 can include antennas used for a wide variety of types of communications. For example, the antennas 394 can include antennas for transmitting and/or receiving signals associated with a wide variety of frequencies and communications standards.

In certain implementations, the antennas 394 support MIMO communications and/or switched diversity communications. For example, MIMO communications use multiple antennas for communicating multiple data streams over a single radio frequency channel. MIMO communications benefit from higher signal to noise ratio, improved coding, and/or reduced signal interference due to spatial multiplexing differences of the radio environment. Switched diversity refers to communications in which a particular antenna is selected for operation at a particular time. For example, a switch can be used to select a particular antenna from a group of antennas based on a variety of factors, such as an observed bit error rate and/or a signal strength indicator.

The mobile device 390 can operate with beamforming in certain implementations. For example, the front end system 393 can include amplifiers having controllable gain and phase shifters having controllable phase to provide beam formation and directivity for transmission and/or reception of signals using the antennas 394. For example, in the context of signal transmission, the amplitude and phases of the transmit signals provided to the antennas 394 are controlled such that radiated signals from the antennas 394 combine using constructive and destructive interference to generate an aggregate transmit signal exhibiting beam-like qualities with more signal strength propagating in a given direction. In the context of signal reception, the amplitude and phases are controlled such that more signal energy is received when the signal is arriving to the antennas 394 from a particular direction. In certain implementations, the antennas 394 include one or more arrays of antenna elements to enhance beamforming.

The baseband system 391 is coupled to the user interface 397 to facilitate processing of various user input and output (I/O), such as voice and data. The baseband system 391 provides the transceiver 392 with digital representations of transmit signals, which the transceiver 392 processes to generate RF signals for transmission. The baseband system 391 also processes digital representations of received signals provided by the transceiver 392. As shown in FIG. 33, the baseband system 391 is coupled to the memory 396 to facilitate operation of the mobile device 390.

The memory 396 can be used for a wide variety of purposes, such as storing data and/or instructions to facilitate the operation of the mobile device 390 and/or to provide storage of user information.

The power management system 395 provides a number of power management functions of the mobile device 390. In certain implementations, the power management system 395 includes a PA supply control circuit that controls the supply voltages of the power amplifiers 401. For example, the power management system 395 can be configured to change the supply voltage(s) provided to one or more of the power amplifiers 401 to improve efficiency, such as power added efficiency (PAE).

As shown in FIG. 33, the power management system 395 receives a battery voltage from the battery 398. The battery 398 can be any suitable battery for use in the mobile device 390, including, for example, a lithium-ion battery.

Technology disclosed herein can be implemented in acoustic wave filters in 5G applications. 5G technology is also referred to herein as 5G New Radio (NR). 5G NR supports and/or plans to support a variety of features, such as communications over millimeter wave spectrum, beamforming capability, high spectral efficiency waveforms, low latency communications, multiple radio numerology, and/or non-orthogonal multiple access (NOMA). Although such RF functionalities offer flexibility to networks and enhance user data rates, supporting such features can pose a number of technical challenges.

The teachings herein are applicable to a wide variety of communication systems, including, but not limited to, communication systems using advanced cellular technologies, such as LTE-Advanced, LTE-Advanced Pro, and/or 5G NR. An acoustic wave device including any suitable combination of features disclosed herein be included in a filter arranged to filter a radio frequency signal in a 5G NR operating band within Frequency Range 1 (FR1). A filter arranged to filter a radio frequency signal in a 5G NR operating band can include one or more BAW devices disclosed herein. FR1 can be from 410 MHz to 7.125 GHz, for example, as specified in a current 5G NR specification. One or more BAW devices in accordance with any suitable principles and advantages disclosed herein can be included in a filter arranged to filter a radio frequency signal in a fourth generation (4G) Long Term Evolution (LTE). One or more BAW devices in accordance with any suitable principles and advantages disclosed herein can be included in a filter having a passband that includes a 4G LTE operating band operating band and a 5G NR operating band. Such a filter can be implemented in a dual connectivity application, such as an E-UTRAN New Radio-Dual Connectivity (ENDC) application.

BAW devices disclosed herein can provide high Q and/or high Q stability in the presence of manufacturing variations. Such features can be advantageous in 5G NR applications. For example, Q stability for BAW devices can be significant in meeting 5G performance specifications at the filter level and/or at the system level.

Figure 34:
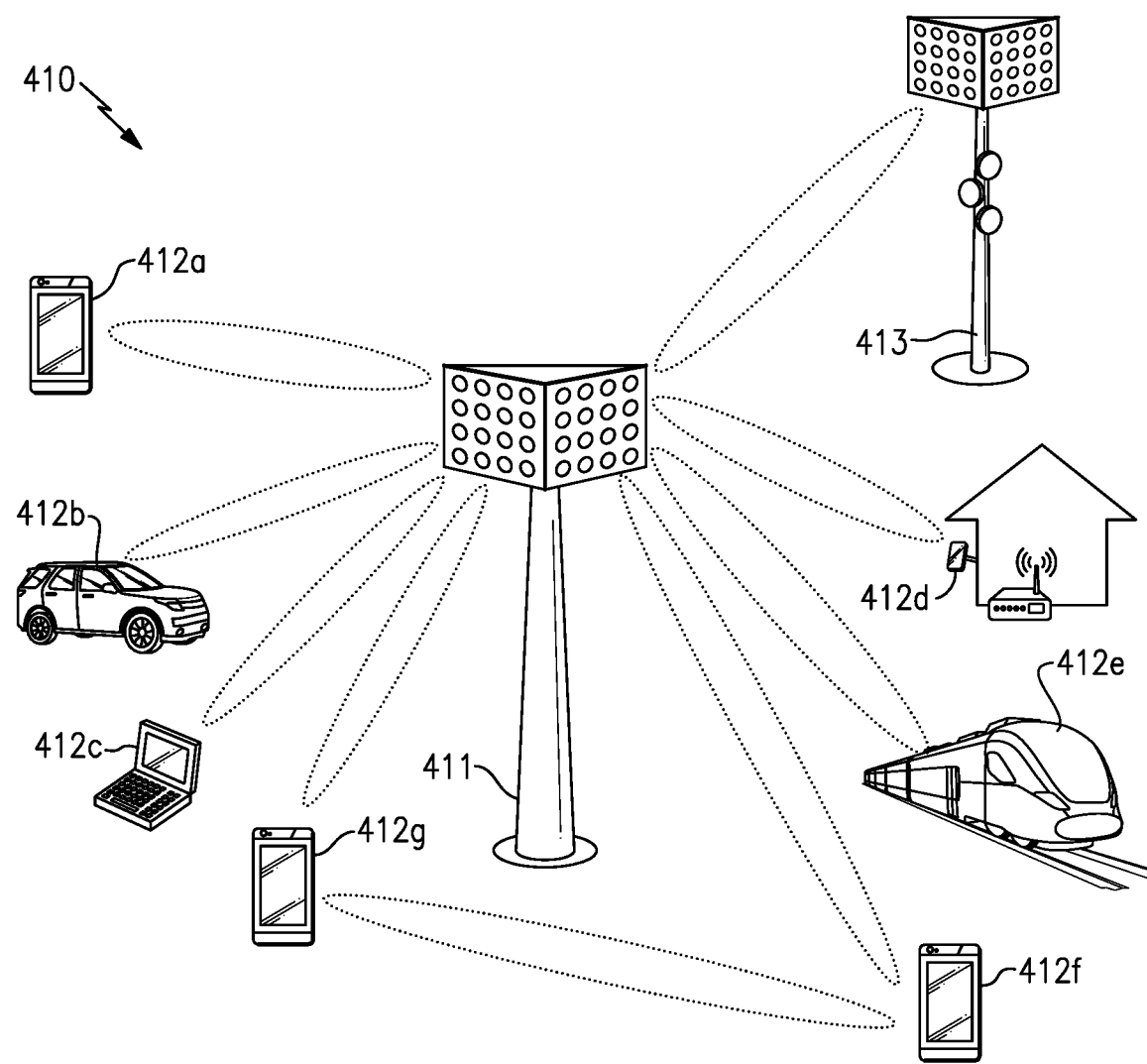
FIG. 34 is a schematic diagram of one example of a communication network.

FIG. 34 is a schematic diagram of one example of a communication network 410. The communication network 410 includes a macro cell base station 411, a small cell base station 413, and various examples of user equipment (UE), including a first mobile device 412a, a wireless-connected car 412b, a laptop 412c, a stationary wireless device 412d, a wireless-connected train 412e, a second mobile device 412f, and a third mobile device 412g. UEs are wireless communication devices. One or more of the macro cell base station 141, the small cell base station 413, or UEs illustrated in FIG. 34 can implement one or more of the acoustic wave filters in accordance with any suitable principles and advantages disclosed herein. For example, one or more of the UEs shown in FIG. 34 can include one or more acoustic wave filters that include any suitable number of BAW resonators with a multi-gradient raised frame structure.

Although specific examples of base stations and user equipment are illustrated in FIG. 34, a communication network can include base stations and user equipment of a wide variety of types and/or numbers. For instance, in the example shown, the communication network 410 includes the macro cell base station 411 and the small cell base station 413. The small cell base station 413 can operate with relatively lower power, shorter range, and/or with fewer concurrent users relative to the macro cell base station 411. The small cell base station 413 can also be referred to as a femtocell, a picocell, or a microcell. Although the communication network 410 is illustrated as including two base stations, the communication network 410 can be implemented to include more or fewer base stations and/or base stations of other types.

Although various examples of user equipment are shown, the teachings herein are applicable to a wide variety of user equipment, including, but not limited to, mobile phones, tablets, laptops, Internet of Things (IoT) devices, wearable electronics, customer premises equipment (CPE), wireless-connected vehicles, wireless relays, and/or a wide variety of other communication devices. Furthermore, user equipment includes not only currently available communication devices that operate in a cellular network, but also subsequently developed communication devices that will be readily implementable with the inventive systems, processes, methods, and devices as described and claimed herein.

The illustrated communication network 410 of FIG. 34 supports communications using a variety of cellular technologies, including, for example, 4G LTE and 5G NR. In certain implementations, the communication network 410 is further adapted to provide a wireless local area network (WLAN), such as WiFi. Although various examples of communication technologies have been provided, the communication network 410 can be adapted to support a wide variety of communication technologies.

Various communication links of the communication network 410 have been depicted in FIG. 34. The communication links can be duplexed in a wide variety of ways, including, for example, using frequency-division duplexing (FDD) and/or time-division duplexing (TDD). FDD is a type of radio frequency communications that uses different frequencies for transmitting and receiving signals. FDD can provide a number of advantages, such as high data rates and low latency. In contrast, TDD is a type of radio frequency communications that uses about the same frequency for transmitting and receiving signals, and in which transmit and receive communications are switched in time. TDD can provide a number of advantages, such as efficient use of spectrum and variable allocation of throughput between transmit and receive directions.

In certain implementations, user equipment can communicate with a base station using one or more of 4G LTE, 5G NR, and WiFi technologies. In certain implementations, enhanced license assisted access (eLAA) is used to aggregate one or more licensed frequency carriers (for instance, licensed 4G LTE and/or 5G NR frequencies), with one or more unlicensed carriers (for instance, unlicensed WiFi frequencies).

As shown in FIG. 34, the communication links include not only communication links between UE and base stations, but also UE to UE communications and base station to base station communications. For example, the communication network 410 can be implemented to support self-fronthaul and/or self-backhaul (for instance, as between mobile device 412g and mobile device 412f).

The communication links can operate over a wide variety of frequencies. In certain implementations, communications are supported using 5G NR technology over one or more frequency bands that are less than 6 Gigahertz (GHz) and/or over one or more frequency bands that are greater than 6 GHz. According to certain implementations, the communication links can serve Frequency Range 1 (FR1), Frequency Range 2 (FR2), or a combination thereof. An acoustic wave filter in accordance with any suitable principles and advantages disclosed herein can filter a radio frequency signal within FR1. In one embodiment, one or more of the mobile devices support a HPUE power class specification.

In certain implementations, a base station and/or user equipment communicates using beamforming. For example, beamforming can be used to focus signal strength to overcome path losses, such as high loss associated with communicating over high signal frequencies. In certain embodiments, user equipment, such as one or more mobile phones, communicate using beamforming on millimeter wave frequency bands in the range of 30 GHz to 300 GHz and/or upper centimeter wave frequencies in the range of 6 GHz to 30 GHz, or more particularly, 24 GHz to 30 GHz.

Different users of the communication network 410 can share available network resources, such as available frequency spectrum, in a wide variety of ways. In one example, frequency division multiple access (FDMA) is used to divide a frequency band into multiple frequency carriers. Additionally, one or more carriers are allocated to a particular user. Examples of FDMA include, but are not limited to, single carrier FDMA (SC-FDMA) and orthogonal FDMA (OFDMA). OFDMA is a multicarrier technology that subdivides the available bandwidth into multiple mutually orthogonal narrowband subcarriers, which can be separately assigned to different users.

Other examples of shared access include, but are not limited to, time division multiple access (TDMA) in which a user is allocated particular time slots for using a frequency resource, code division multiple access (CDMA) in which a frequency resource is shared amongst different users by assigning each user a unique code, space-divisional multiple access (SDMA) in which beamforming is used to provide shared access by spatial division, and non-orthogonal multiple access (NOMA) in which the power domain is used for multiple access. For example, NOMA can be used to serve multiple users at the same frequency, time, and/or code, but with different power levels.

Enhanced mobile broadband (eMBB) refers to technology for growing system capacity of LTE networks. For example, eMBB can refer to communications with a peak data rate of at least 10 Gbps and a minimum of 100 Mbps for each user. Ultra-reliable low latency communications (uRLLC) refers to technology for communication with very low latency, for instance, less than 3 milliseconds. uRLLC can be used for mission-critical communications such as for autonomous driving and/or remote surgery applications. Massive machine-type communications (mMTC) refers to low cost and low data rate communications associated with wireless connections to everyday objects, such as those associated with Internet of Things (IoT) applications.

The communication network 410 of FIG. 34 can be used to support a wide variety of advanced communication features, including, but not limited to, eMBB, uRLLC, and/or mMTC.

Any of the embodiments described above can be implemented in association with mobile devices such as cellular handsets. The principles and advantages of the embodiments can be used for any systems or apparatus, such as any uplink wireless communication device, that could benefit from any of the embodiments described herein. The teachings herein are applicable to a variety of systems. Although this disclosure includes some example embodiments, the teachings described herein can be applied to a variety of structures. Any of the principles and advantages discussed herein can be implemented in association with RF circuits configured to process signals in a frequency range from about 30 kHz to 300 GHz, such as in a frequency range from about 450 MHz to 5 GHz, in a frequency range from about 450 MHz to 8.5 GHz or in a frequency range from about 450 MHz to 10 GHz.

Aspects of this disclosure can be implemented in various electronic devices. Examples of the electronic devices can include, but are not limited to, consumer electronic products, parts of the consumer electronic products such as packaged radio frequency modules, uplink wireless communication devices, wireless communication infrastructure, electronic test equipment, etc. Examples of the electronic devices can include, but are not limited to, a mobile phone such as a smart phone, a wearable computing device such as a smart watch or an ear piece, a telephone, a television, a computer monitor, a computer, a modem, a hand-held computer, a laptop computer, a tablet computer, a microwave, a refrigerator, a vehicular electronics system such as an automotive electronics system, a stereo system, a digital music player, a radio, a camera such as a digital camera, a portable memory chip, a washer, a dryer, a washer/dryer, a copier, a facsimile machine, a scanner, a multi-functional peripheral device, a wrist watch, a clock, etc. Further, the electronic devices can include unfinished products.

Unless the context indicates otherwise, throughout the description and the claims, the words "comprise," "comprising," "include," "including" and the like are to generally be construed in an inclusive sense, as opposed to an exclusive or exhaustive sense; that is to say, in the sense of "including, but not limited to." Conditional language used herein, such as, among others, "can," "could," "might," "may," "e.g.," "for example," "such as" and the like, unless specifically stated otherwise, or otherwise understood within the context as used, is generally intended to convey that certain embodiments include, while other embodiments do not include, certain features, elements and/or states. The word "coupled", as generally used herein, refers to two or more elements that may be either directly connected, or connected by way of one or more intermediate elements. Likewise, the word "connected", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Detailed Description using the singular or plural number may also include the plural or singular number respectively.

While certain embodiments have been described, these embodiments have been presented by way of example only, and are not intended to limit the scope of the disclosure. Indeed, the novel resonators described herein may be embodied in a variety of other forms. Furthermore, various omissions, substitutions and changes in the form of the resonators described herein may be made without departing from the spirit of the disclosure. Any suitable combination of the elements and/or acts of the various embodiments described above can be combined to provide further embodiments. The accompanying claims and their equivalents are intended to cover such forms or modifications as would fall within the scope and spirit of the disclosure.

What is claimed is:
1. A bulk acoustic wave device comprising:
   a first electrode;
   a second electrode;

a piezoelectric layer positioned between the first electrode and the second electrode; and a multi-layer raised frame structure configured to cause lateral energy leakage from a main acoustically active region of the bulk acoustic wave device to be reduced, the multi-layer raised frame structure including a first raised frame layer embedded in the piezoelectric layer and a second raised frame layer, the first raised frame layer having a lower acoustic impedance than the piezoelectric layer, the second raised frame layer at least partly overlapping with the first raised frame layer in a raised frame region of the bulk acoustic wave device, and the bulk acoustic wave device being configured to generate a bulk acoustic wave.

2. The bulk acoustic wave device of claim 1 wherein the second raised frame layer is embedded in the piezoelectric layer.

3. The bulk acoustic wave device of claim 1 wherein the first raised frame layer includes an oxide and the second raised frame layer includes a metal.

4. The bulk acoustic wave device of claim 1 wherein the first raised frame layer is a silicon dioxide layer and the second raised frame layer is metallic.

5. The bulk acoustic wave device of claim 4 wherein the second raised frame layer is embedded in the piezoelectric layer.

6. The bulk acoustic wave device of claim 1 wherein the multi-layer raised frame structure is a multi-gradient raised frame structure.

7. The bulk acoustic wave device of claim 6 wherein the second raised frame layer extends beyond the first raised frame layer on opposing sides of the multi-layer raised frame structure.

8. The bulk acoustic wave device of claim 6 wherein the multi-gradient raised frame structure has a non-gradient portion between two gradient portions.

9. The bulk acoustic wave device of claim 6 wherein the second raised frame layer has a first taper angle on a first side and a second taper angle on a second side, and the first and second taper angles are each greater than 5 degrees and less than 45 degrees.

10. The bulk acoustic wave device of claim 1 wherein the multi-layer raised frame structure surrounds the main acoustically active region of the bulk acoustic wave device in plan view.

11. The bulk acoustic wave device of claim 1 wherein the bulk acoustic wave device is a film bulk acoustic resonator.

12. An acoustic wave filter comprising:
a bulk acoustic wave device configured to generate a bulk acoustic wave,
the bulk acoustic wave device including a first electrode, a second electrode, a piezoelectric layer positioned between the first electrode and the second electrode, and a multi-layer raised frame structure configured to cause lateral energy leakage from a main acoustically active region of the bulk acoustic wave device to be reduced, the multi-layer raised frame structure including a first raised frame layer and a second raised frame layer, the first raised frame layer being embedded in the piezoelectric layer and having a lower acoustic impedance than the piezoelectric layer, and the second raised frame layer at least partly overlapping with the first raised frame layer in a raised frame region of the bulk acoustic wave device; and at least one additional acoustic wave device, the bulk acoustic wave device and the at least one additional acoustic wave device together arranged to filter a radio frequency signal.

13. The acoustic wave filter of claim 12 wherein the at least one additional acoustic wave device includes a second bulk acoustic wave device that includes a raised frame layer embedded in a piezoelectric layer of the second bulk acoustic wave device.

14. The acoustic wave filter of claim 12 wherein the multi-layer raised frame structure is a multi-gradient raised frame structure.

15. The acoustic wave filter of claim 14 wherein the second raised frame layer has a first taper angle on a first side and a second taper angle on a second side, and the first and second taper angles are each greater than 5 degrees and less than 45 degrees.

16. The acoustic wave filter of claim 12 wherein the first raised frame layer is an oxide and the second raised frame layer is metallic.

17. The acoustic wave filter of claim 12 wherein the first raised frame layer is a silicon dioxide layer.

18. A packaged radio frequency module comprising:
an acoustic wave filter including a bulk acoustic wave device configured to generate a bulk acoustic wave, the bulk acoustic wave device including a first electrode, a second electrode, a piezoelectric layer positioned between the first electrode and the second electrode, and a multi-layer raised frame structure configured to cause lateral energy leakage from a main acoustically active region of the bulk acoustic wave device to be reduced, the multi-layer raised frame structure including a first raised frame layer and a second raised frame layer, the first raised frame layer being embedded in the piezoelectric layer and having a lower acoustic impedance than the piezoelectric layer, and the second raised frame layer at least partly overlapping with the first raised frame layer in a raised frame region of the bulk acoustic wave device;
a radio frequency circuit element; and
a package structure enclosing the acoustic wave filter and the radio frequency circuit element.

19. The packaged radio frequency module of claim 18 wherein the radio frequency circuit element is a radio frequency switch.

20. The packaged radio frequency module of claim 18 wherein the radio frequency circuit element is a radio frequency amplifier.

* * * * *

UNITED STATES PATENT AND TRADEMARK OFFICE
CERTIFICATE OF CORRECTION

PATENT NO. : 12,101,077 B2
APPLICATION NO. : 17/472199
DATED : September 24, 2024
INVENTOR(S) : Benfeng Zhang et al.

Page 1 of 1

It is certified that error appears in the above-identified patent and that said Letters Patent is hereby corrected as shown below:

On the Title Page

In Column 2, Line 1, item (56) under Other Publications, delete "as 2022/0094323 A1, filed" and insert --as 2022/0094324 A1, filed--.

In Column 2, Line 2, item (56) under Other Publications, delete "filed Sep. 19, 2021," and insert --filed Sep. 10, 2021,--.

In Column 2, Line 2, item (56) under Other Publications, delete "Multi-Grandient Raised" and insert --Multi-Gradient Raised--.

In the Specification

In Column 9, Line 1, delete "iridium (Jr), platinum" and insert --iridium (Ir), platinum--.

In Column 9, Line 29, delete "Ru, Jr, Cr," and insert --Ru, Ir, Cr,--.

Signed and Sealed this
Seventh Day of January, 2025

Derrick Brent
*Acting Director of the United States Patent and Trademark Office*